(12) United States Patent
Hurwitz et al.

(10) Patent No.: US 7,669,320 B2
(45) Date of Patent: Mar. 2, 2010

(54) CORELESS CAVITY SUBSTRATES FOR CHIP PACKAGING AND THEIR FABRICATION

(75) Inventors: Dror Hurwitz, Gilboa (IL); Mordechay Farkash, Haifa (IL); Eva Igner, Haifa (IL); Boris Statnikov, Nazareth Ilit (IL); Benny Michaeli, Nazareth Ilit (IL)

(73) Assignee: Amitec-Advanced Multilayer Interconnect Technologies Ltd., Migdal HaEmek (IL)

( * ) Notice: Subject to any disclaimer, the term of this patent is extended or adjusted under 35 U.S.C. 154(b) by 336 days.

(21) Appl. No.: 11/737,269

(22) Filed: Apr. 19, 2007

(65) Prior Publication Data

US 2007/0289127 A1    Dec. 20, 2007

(30) Foreign Application Priority Data

Apr. 20, 2006  (IL)  .................................... 175011

(51) Int. Cl.
*H05K 3/10* (2006.01)

(52) U.S. Cl. .............................. 29/846; 29/831; 29/842; 29/847; 257/678; 257/787; 257/E23.001; 257/E23.194; 174/260; 438/25; 438/26; 438/42; 438/106; 438/580; 216/13; 216/17; 216/20; 216/41

(58) Field of Classification Search ........... 29/846–867; 438/25, 26, 42, 106, 107, 109, 121, 149, 438/156, 164, 580, 706, 180; 216/13, 17–18, 216/20, 41, 49, 52, 57, 58, 67, 83, 88, 105; 427/96.1, 97.1–97.4, 97.9–98.1; 205/125–126; 361/760, 792–795; 174/260–266; 257/678–733, 257/787–796, E23.001–E23.194

See application file for complete search history.

(56) References Cited

U.S. PATENT DOCUMENTS

2007/0096292 A1*  5/2007  Machida ..................... 257/700

* cited by examiner

*Primary Examiner*—Derris H Banks
*Assistant Examiner*—Azm Parvez
(74) *Attorney, Agent, or Firm*—Dennison, Schultz & MacDonald

(57) ABSTRACT

A method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper.

36 Claims, 45 Drawing Sheets

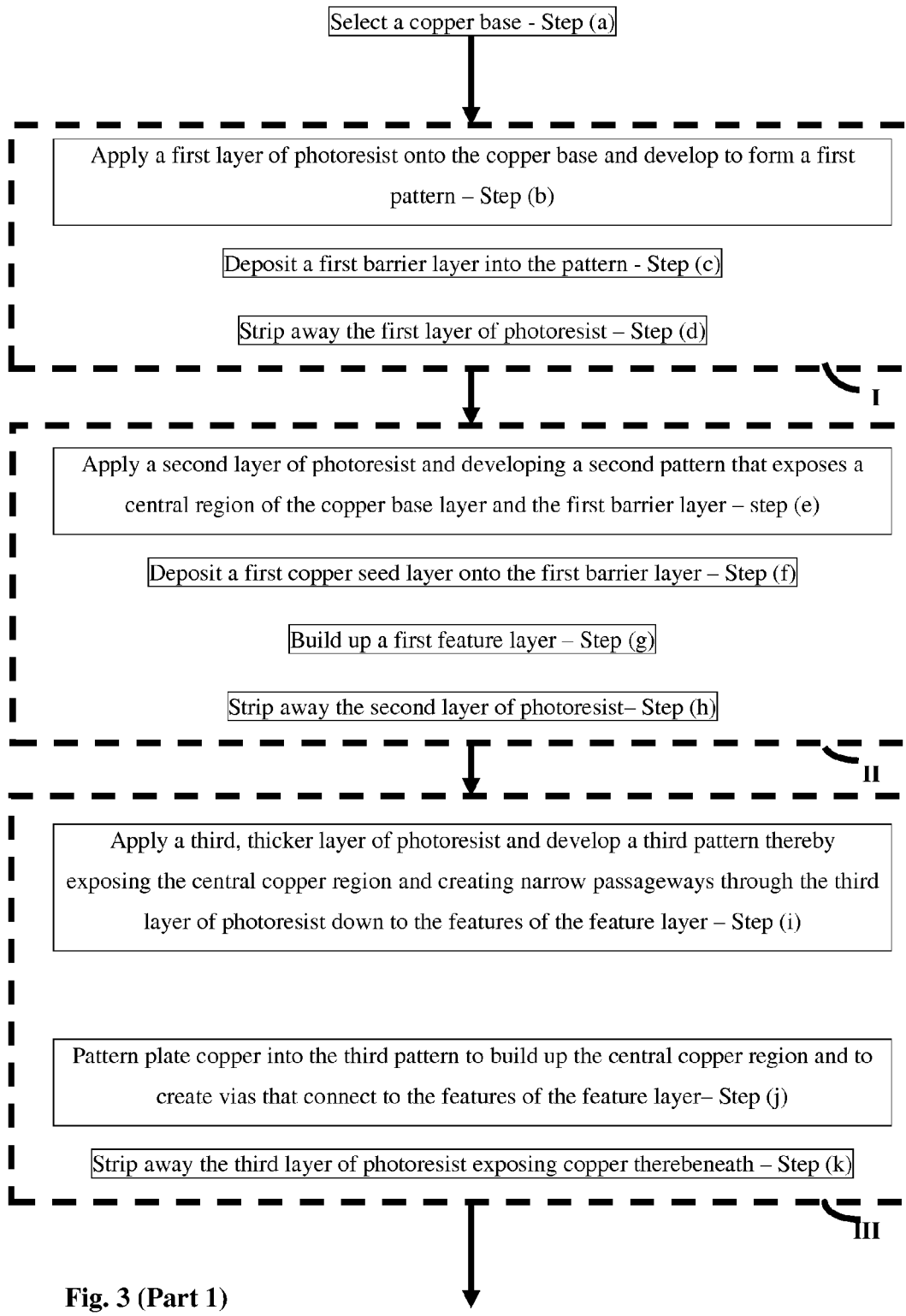
Fig. 3 (Part 1)

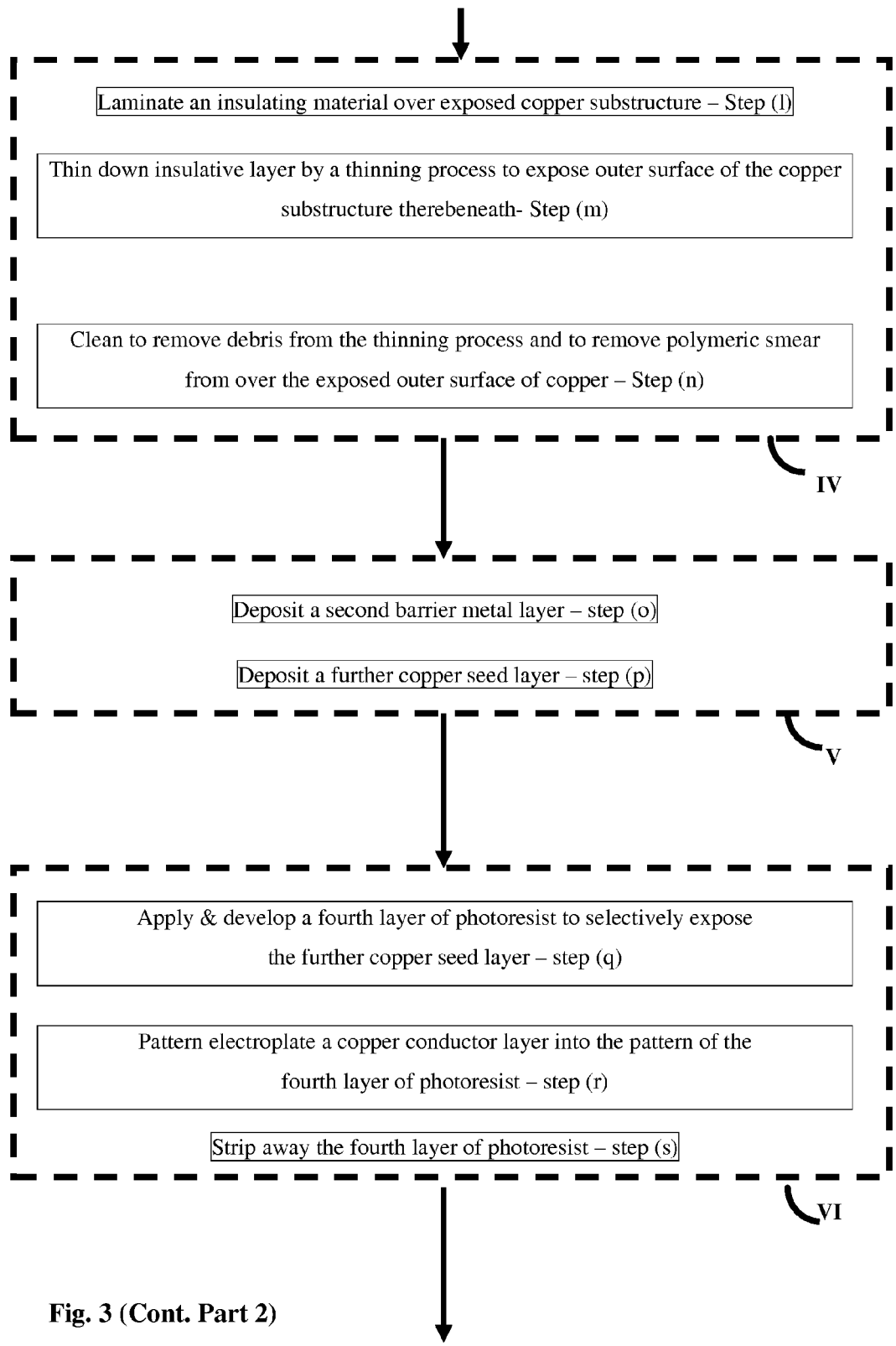
Fig. 3 (Cont. Part 2)

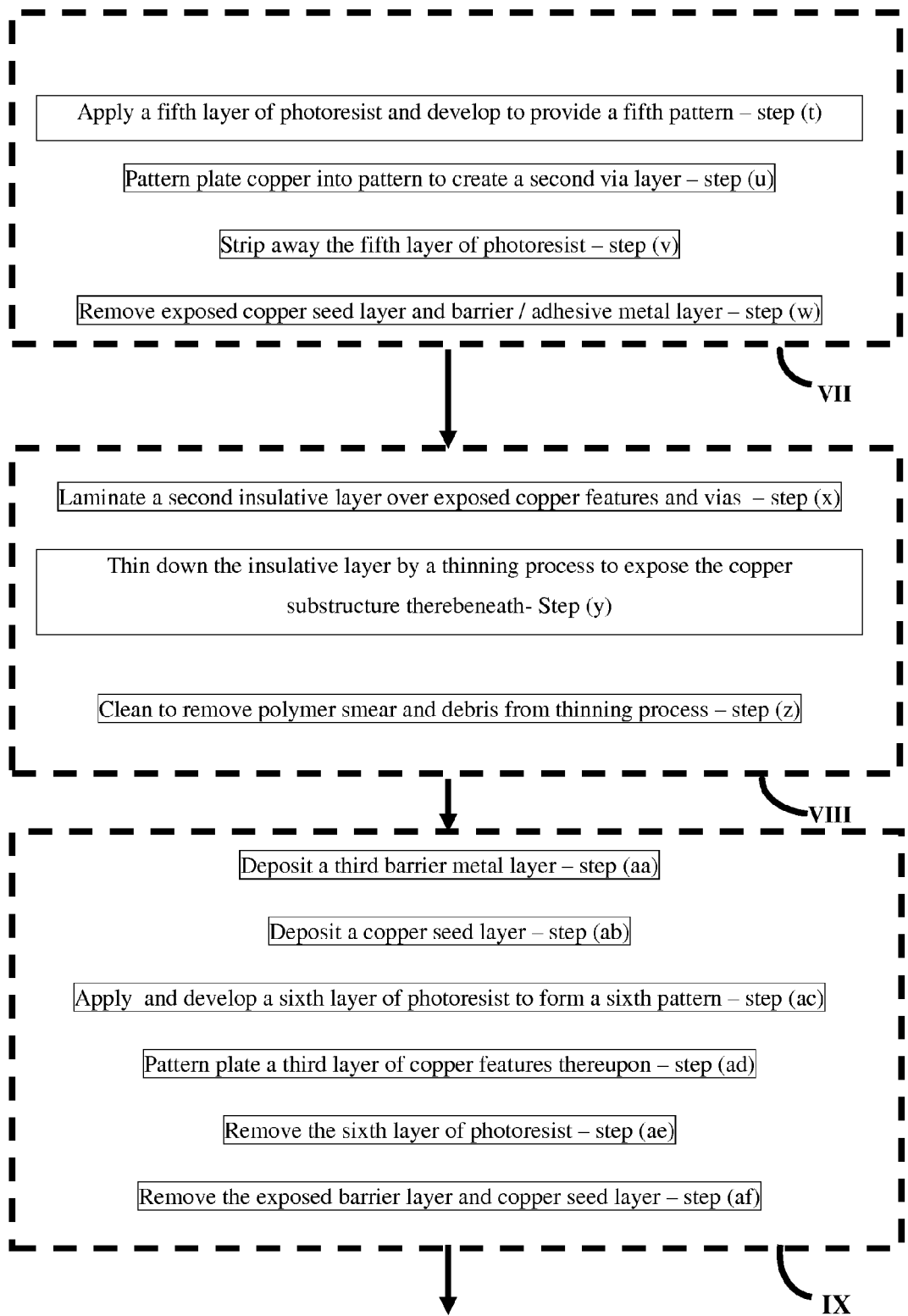
Fig. 3 (Cont. Part 3)

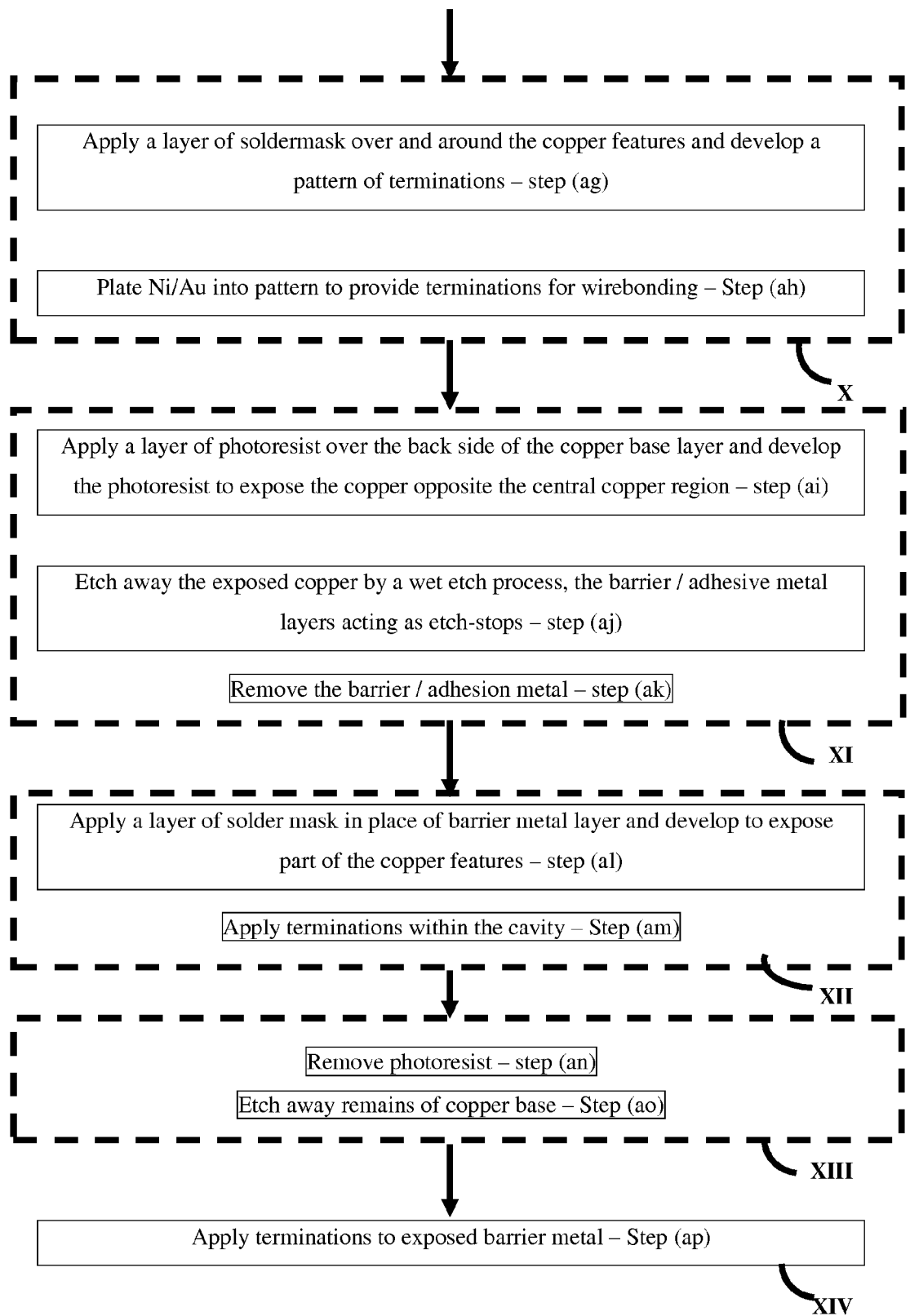
Fig. 3 (Cont. Part 4)

CORELESS CAVITY SUBSTRATES FOR CHIP PACKAGING AND THEIR FABRICATION

FIELD OF THE INVENTION

The present invention is directed to providing coreless cavity substrates for packaging integrated circuits, and to methods for the manufacture thereof.

BACKGROUND

Electronic products in general and mobile devices in particular, have revolutionized the world over the past few decades with laptop computers, palm computers, wireless phones, digital cameras, to name just a few electronic products developed in recent years. Subsequent generations of such products are ever more compact, with improved features and functions. The integrated circuit (IC) and the more efficient packaging of the IC have played pivotal roles in enhancing the functionality and further miniaturization of these products.

As the IC of such products becomes ever more complex, the IC package continually requires more interconnections (pins or leads) with its surroundings to support increased logic and power requirements. At the same time, the IC package is required to be ever smaller and thinner to save space. Furthermore, the IC package is required to be highly thermally conductive to allow dissipation of the substantial amounts of heat generated by the operation of the IC. The IC package is also required to support the significantly increased processing speed and memory resources of the IC. A widely used technique to further improve system performance is to mount different ICs in close proximity, which also aids further miniaturization of course. In computers, for example, as the IC processing speed increases, the signal attenuation between the processor and the IC memory becomes of concern.

In consequence of the above, as the complexity and density of semiconductor devices has increased, the need for new and improved packaging techniques has also arisen. The so-called Multi-Chip Module (MCM) containing multiple devices in a single package is one such improved packaging technique. In an MCM, multiple semiconductor and passive devices are placed on a common substrate. Sealing this substrate and its ICs protects the devices and creates a powerful electrical component. This technique achieves a higher degree of device density and functionality than separately packaged semiconductor devices mounted on a printed circuit board. The higher density of the MCM translates to reduced data processing times within the ICs, while increasing memory and other required computing resources. Furthermore, by allowing the buses and interconnects of the MCM substrate to operate at the same speed and signal integrity levels as the IC itself, the partitioning of a complex IC into several simpler sub-units becomes a possibility. This approach not only allows cost reduction of the complex IC but typically shortens their time-to-market as well.

One common solution, already used in many portable electronic devices such as mobile phones and the like, is an MCM package that combines one or more processor chips, such as Digital Signal Processors (DSPs), with one or more memory ICs for enhanced functionality and performance.

More recently, multi-chip packaging methods have been proposed that provide for a plurality of chips deployed in more than one layer of a package. Examples include a stack of chips that are wire-bonded, flip chip bonded and/or otherwise bonded to one another and to the package substrate. It will be appreciated that the footprint of the multi-chip package is significantly reduced by this vertical orientation approach, but complex chip to chip interconnection techniques, such as for the stacked chip edge connection designs, may be required. For connecting chips to each other and to the package substrate, existing processing techniques sometimes require two or more methods, such as flip chip, wire bonding, and/or tape-automated bonding, for example. These and other currently available techniques may require a larger package height to accommodate multiple IC chips and wire-bond loops.

Another solution, which may be used together with stacked ICs, is to use cavity substrates, where a chip is fitted within the thickness of the substrate.

U.S. Pat. No. 4,682,414 to Butt, filed back in 1985, describes a multilayer circuitry having one element positioned within a recess or cavity, and a second element mounted on the surface. The multilayer circuitry typically consists of alternating metallic conductive and ceramic or glass dielectric layers that are manually built up onto a metallic substrate. As described in column 6 lines 20-28 however, the dielectric layer may comprise polyimide (Kapton). The metallic conductive layers are interconnected by drilling holes through the stack, which are then filled with copper, by electroless plating, for example. This requires holes to be drilled through the substrate, one at a time, in a stepwise manner, and is thus very time-consuming, expensive and inefficient. The technology used for forming the recess for the IC is not discussed.

U.S. Pat. No. 4,764,846 to Go describes a high density electronic package comprising stacked modules, wherein each cavity providing submodule may be formed by mounting a rectangle onto a base, or by etching out the cavity therefrom. The stacked structure has at least one interconnect plane that is adapted to be electrically connected to external circuitry. To connect to the outside world, electrical leads are formed on the surface of the substrate. The individual chip carrying carriers are laminated to form a stack.

U.S. Pat. No. 5,396,032 to Bonham describes a method and apparatus for providing electrical access to devices in a multi-chip module (MCM). Essentially a package body having a cavity is provided, and a plurality of ICs is stacked into the cavity. The package is designed to fit into a lead frame, and the gains in surface area saved by stacking ICs is offset by the large surface area required by the lead frame.

U.S. Pat. No. 5,495,394 describes three dimensional die packaging in multichip modules. Each substrate may include a cavity for mounting a chip therein, and has circuitry printed on the surface of the substrate. Within a multilayer stack, there is a plurality of signal layers, but each chip has all the circuitry thereto fabricated in a single layer. This planar requirement fundamentally limits the complexity of connections available to each chip. The possibility of interlayer connections by through plated vias is discussed (See Column 3 lines 5-10). It will be appreciated however, that such a connection technology is inherently expensive as each via is required to be drilled and then filled, and the drilling has to be done one via at a time, stepwise. This makes production time consuming and hence, expensive.

U.S. Pat. No. 5,579,207 to Hayden et al. describes another approach to three dimensional integrated circuit stacking. Ceramic sheets with cavities therein are stacked, and conduction between layers is accomplished by vias fabricated by drilling and filling with a conductive paste. The dielectric constants of most ceramics are relatively large, and the dielectric constant of alumina, the primary constituent of ceramic materials used in these substrates, is relatively high. This results in ceramic chip carriers exhibiting relatively low signal propagation speeds in comparison to substrates of other materials, particularly those with organic components, such as fiberglass-reinforced epoxy resin, polytetrafluoroethylene (Teflon), and the like.

U.S. Pat. No. 5,622,588 to Weber describes methods of making multi-tier laminate substrates for electronic device packaging. A method is disclosed for making multi-tier laminate substrates for electronic device packaging including providing a first laminating layer and a second laminating layer, each having a trace on a first side. These layers are laminated with a spacer layer and dielectric layers. A window is made in each of the spacer and the dielectric layers. After laminating the layers together, vias are formed. Then an opening is made in the first laminating layer that corresponds to the window openings in order to produce a cavity in the laminated structure for placing an electronic device therein.

The opening for the die cavity in the substrate is fabricated by milling (see Column 2 lines 34, 39, 45, column 7 line 42, column 9 line 43) and the vias are made through the laminated substrate and then plated (See column 3 lines 22-23), the fabrication technique being drilling (see column 8 line 27). Alternative processing in the form of laser based micromachining is also discussed (column 7 line 24).

U.S. Pat. No. 6,207,354 to Bhatt et al. describes a method of making an organic chip carrier substrate including a cavity for an IC. The substrate described is fabricated by lamination, with dielectric layers such as fiber reinforced epoxy being laid down onto a metallic substrate. The cavity is typically formed by a routing or profiling machine. However, other fabrication methods such as punching and drilling are also discussed (see column 6 line 16 to 31). These techniques are characterized by poor dimensional accuracy and low precision. Laser ablation is also mentioned.

U.S. Pat. No. 6,274,391 to Wachtler et al. (assigned to Texas Instruments) describes an HDI Land grid array packaged device having electrical and optical interconnects. A substrate is selected from any of a wide range of materials, and a cavity is formed or milled out (Column 8 line 48). After building up the structure, which may be accomplished by laminating dielectric layers and depositing metal layers thereupon, vias are formed. In addition to laser ablation, chemical processing such as liquid, gas or plasma processing is discussed (Column 9 line 18 to 25). It would appear therefore, that the use of etching to fabricate vias is considered. The manufacturing technique described includes forming a cavity in the substrate, inserting the semiconductor device into the cavity, and only then building up the layered structure. Finally, vias are formed by creating holes through the structure which may be subsequently filled.

U.S. Pat. No. 6,266,251 to Bassi et al. describes a cavity downward, ball grid array module having a cavity for absorbing excess chip adhesive. It does not relate to efficient inter chip vias.

U.S. Pat. Nos. 6,226,696 and 6,306,686 to Horton et al. (assigned to IBM) describe a method of fabricating an electronic package with interconnected chips. A cavity is formed right through a substrate, two chips are mounted in the cavity and then a heat sink is added. They do not relate to efficient inter chip vias either.

U.S. Pat. No. 6,492,253 to Chia et al. describes a method for programming a substrate for array type packages. The substrate is fabricated from a nonconductive material and vias are drilled there through and then filled with conductor. Such a connection technology is inherently expensive as each via is required to be drilled and then filled, and the drilling has to be performed stepwise, one via at a time. This makes production time-consuming and hence, expensive.

U.S. Pat. No. 6,507,107 to Vaiyapuri (Micron Technology Inc.) describes a semiconductor/printed circuit board assembly. One substrate supporting a semiconductor die is stacked upon another, and the connections there-between are by conductive lines (wires) that pass through hole in the substrate. To reduce the thickness of the stack, the mounting of semiconductor dies within cavities within each substrate is contemplated. However, methods of formation of these cavities are not discussed.

U.S. Pat. No. 6,558,978 to McCormick describes a "chip-over-chip" integrated circuit package, where chips are stacked using cavity-less semiconductor substrates. This approach will, of necessity, result in a relatively thick stack.

Published United States Application Number US 2003/0192171 to Fey et al. entitled "Space saving packaging of electronic circuits" describes an apparatus and packaging method for stacking a plurality of integrated circuit substrates which provides interconnection paths through the substrates to simplify electrical connections between the integrated circuits whilst facilitating minimization of the volume and customization of the three dimensional package size to conform to the available internal space within a housing. The publication is directed to packaging techniques for electronic circuits and in particular to vertical stacking of a plurality of electronic circuits. Preferred embodiments of the chip stack include a cavity for containing and protecting surface mounted devices such as a crystal and the like. No description of the cavity production technique is given.

U.S. Pat. No. 6,781,243 to Li et al. (National Semiconductor Corporation) describes a leadless lead frame package substitute and stack package in which a semiconductor package is provided with an internal package formed in the cavity of the external leadless lead frame package (LLP). The internal package is a leadless lead frame package and provides a substrate for mounting one or more dies and passive devices to form the external LLP. By arranging the die and passive components on the internal package, higher chip density and a smaller form factor may be achieved.

WIPO Publication Number WO 2004/012266 to Figueroa et al. (Intel Corporation) entitled "Electronic package substrate with back side, cavity mounted capacitors and method of fabrication therefor" describes an electronic package, such as an integrated circuit package, that includes a cavity on the back side of the package, which is the same side on which connectors to a next level of interconnect are located. Contacts which enable one or more discrete capacitors to be electrically connected to the package are provided within the cavity. The package provides a very low vertical inductance path between the capacitors and an integrated circuit mounted on the front side of the package. As described on page 9 lines 31 to 32 thereof, in one embodiment the cavity is formed using a masking and etching process as known in the art.

U.S. Pat. No. 6,790,760 to Cohn et al. (Broadcom Corporation) describes a method of manufacturing an integrated circuit package. A multilayer substrate is proposed and once again, the vias are formed by drilling and plating.

U.S. Pat. No. 6,869,827 to Vaiyapuri (Micron Technology, Inc) entitled "Semiconductor/printed circuit board assembly, and computer system" describes a stacking method for a semiconductor die that involves forming topographic contacts extending from a second surface of an intermediate substrate to a first surface of a printed circuit board. Two or more chips, each mounted on a substrate are stacked into a layered structure, where the contact wires pass through openings in the intermediate substrates.

U.S. Pat. No. 6,861,750 to Zhao et al. describes a ball grid array package with multiple interposers wherein the various IC packages are mounted on stiffeners and stacked, and the vertical height of the stack may be reduced by using cavities, or openings, which are cutouts or notches (column 11 line 65, column 12 lines 3 and 16).

U.S. Pat. No. 6,896,553 to Zhao et al. (Broadcom Corporation) entitled "An enhanced die up ball grid array packages with two substrates" relates to a ball grid array package for high-speed integrated circuits that has a first substrate surface attached to a first stiffener surface, and a second substrate surface attached to a second stiffener surface. Of particular interest, in column 19 lines 55 to 60 thereof, in one embodiment, the openings for the passage of wire bonds are fabricated by an acid etch process. The central opening for the IC chip is fabricated by cutting or punching out however.

U.S. Pat. No. 6,882,042 to Zhao et al. (Broadcom Corporation) relates to a thermally and electrically enhanced ball grid array package. As described in column 5 lines 35 to 40, the substrate of the BGA package may comprise alternating metal layers and dielectric layers with conductive vias. The opening or window in the substrate, for chip mounting is punched out (See column 6 line 19, column 6 line 42 and Table 2 thereof).

U.S. Pat. No. 6,930,364 to Bruner describes a microelectronic mechanical system and method that creates a cavity in a silicon dioxide or silicon nitride substrate by sacrificial etching using a gas etching technique with a noble gas fluoride $NGF_{2x}$.

U.S. Pat. No. 6,949,289 to Lawton et al. entitled "impregnated glass fiber strands and products including the same" is incorporated herein by reference. It describes, inter alia, usage of fiber reinforced composites as electronic support structures, as chip packages, PCBs and the like. Such FRCs may be copper clad (Column 89 lines 10 to 15). Vias are described as being fabricable by mechanical and laser drilling (see Column 54 lines 1-18).

U.S. Pat. No. 6,949,823 to Schott et al. describes a method and apparatus for high electrical and thermal performance ball grid array package, wherein the package is constructed from thick film ceramic and the cavity is fabricating by laser cutting.

U.S. Pat. No. 6,964,881 to Chua et al. (Micron Technology, Inc.) entitled "Multi-chip wafer level system packages and methods of forming same" relates to a packaging implementation providing a multichip multilayer system on a chip solution wherein greater integration of a plurality and variety of known good die (sic) contained within cavities formed in a separate substrate is achieved. Additional redistribution and interconnect layers above the multichip configuration may be formed with the redistribution layers terminating in electrical connections such as conductive bumps or balls. In one embodiment, the cavities of the substrate receive signal device connections, such as conductive bumps, of a plurality of semiconductor dice in a flip-chip configuration. A portion of the back surface of the substrate is then removed to a depth sufficient to expose the conductive bumps. In another embodiment, the cavities receive the semiconductor dice with the active surface of the semiconductor dice facing up, wherein metal layer connections are formed and coupled to bond pads or other electrical connectors of the semiconductor dice. The substrate is typically a silicon wafer (Column 3 line 58) and the cavities are formed using an anisotropic silicon etching process (column 5 line 46). The stack build up may include alternating metal, e.g. copper (column 8 line 5) and dielectric layers. Vias or openings may be formed by etching (column 8 line 18). As shown in claim 1 (column 9 line 41) the cavities are formed on the top surface of the substrate (silicon wafer, see column 10 line 26) prior to build up of the laminate structure.

It will be appreciated that micromachining processes, such as drilling, milling, laser micro ablation and micro cutting, are processes that fabricate holes one hole at a time. The formation of vias and cavities one at a time in this manner is time consuming and hence, expensive. For mass production, where many packages are fabricated at once, such techniques are inherently unsuitable.

Thus, despite the developments described above, there is still a need for manufacturing processes and chip support structures, particularly cavity support structures that overcome the disadvantages of the prior art, and that are economical and particularly suitable for large scale manufacture.

Consequently, there is a need for an improved multi-chip package technology that increases package density, and improves performance, including increasing access speeds between chips by significantly reducing interconnect traces and via lengths, while not substantially increasing package height or the complexity of packaging processing techniques. To minimize production time and to optimize throughput, such a technology should avoid laser ablation, mechanical milling and drilling of vias, cavities and the like and having high yield, and excellent reliability.

In some applications it is desirable to separate different functionality such as memory and processing capabilities into two separate chips. To save space, which is often at a premium, and to facilitate further miniaturization, it is desirable to stack the memory and processor chips, one on top of the other. To facilitate this, a cavity substrate is desirable. The present invention provides a cavity substrate and a manufacturing technique thereof.

SUMMARY OF THE INVENTION

It is an aim to provide a manufacturing technique that attains high yields.

It is a further aim of the invention to provide a manufacturing route for a compact, reliable packaging support for two or more IC chips that is economical and is particularly suitable for large scale manufacture.

It is a specific aim of a preferred embodiment of the invention to provide a manufacturing technique for a coreless IC support substrate having dimensions of several millimeters, and a thickness of less than 1 mm, and having a cavity therein of around 1 $cm^2$, such that a first IC may be wire bonded or otherwise attached to the Ni/Au terminations on the top side of the IC support thus formed, and a second IC may be connected within the cavity, by a Ball Grid Array (BGA), Land Grid Array (LGA) of solder bumps. Solder or other termination contacts may then be applied over outer vias of the substrate.

It is a further specific aim of a preferred embodiment of the invention to provide a coreless IC support substrate, such that a first IC may be wire bonded or otherwise attached to the Ni/Au terminations on the top side of the IC support thus formed, and a second IC may be connected within the cavity, by a ball grid array or land grid array of solder bumps. Solder or other termination contacts may be applied over outer vias of the substrate.

The above dimensions are by way of example only.

In a first embodiment a method of fabricating a cavity IC support is provided, the method comprising the steps of: Selecting a copper base—Step (a); (I) Applying a barrier metal layer; (II) Applying a first feature layer; (III) Applying a first layer of vias; (IV) Applying a first layer of insulating material around the copper features and vias; (V) Applying a second barrier metal layer; (VI) Applying a second layer of copper features; (VII) Applying a second layer of vias; (VIII) Applying a second layer of insulating material around the copper features and vias; (IX) Applying a third layer of copper features to form a multilayered structure; (X) Applying terminations on upper surface of the multilayered structure; (XI) Forming a cavity in the underside of the multilayered structure; (XII) Terminating contacts in the cavity, and (XIII) Etching away the remainder of the copper base and (XIV) Terminating the exposed conduits.

Optionally, step I of applying a barrier metal layer comprises the following substeps: Applying a first layer of photoresist onto the copper base and developing to form a first pattern—Step (b); Depositing the first barrier metal layer into the pattern—Step (c), and Stripping away the first layer of photoresist—Step (d).

Typically, the first barrier metal layer is selected from the list comprising: nickel, gold, gold followed by nickel, tin, lead and tin-lead alloys.

Optionally, step II of applying a first feature layer comprises the following substeps: Applying a second layer of photoresist and developing a second pattern that exposes a central region of the copper base layer and the first barrier metal layer
 step (e); Depositing a first copper seed layer onto the first barrier metal layer
 Step (f); Building up a first copper feature layer—Step (g), and Stripping away the second layer of photoresist—Step (h).

Optionally, step III of applying a via layer comprises the following substeps: Applying a third, thicker layer of photoresist and developing a third pattern thereby exposing the central copper region and creating narrow passageways through the third layer of photoresist down to features of the first feature layer—Step (i); Pattern plating copper into the third pattern to build up the central copper region and to create vias that connect to the features of the first feature layer—Step (j), and Stripping away the third layer of photoresist and exposing copper therebeneath—Step (k).

Optionally, step III of applying an insulating material comprises the following substeps: Laminating an insulating material over exposed copper substructure—Step (1); Thinning down the insulating layer by a thinning process to expose outer surface of copper substructure therebeneath—Step (m), and Cleaning to remove debris from the thinning process and to remove polymeric smear from over the exposed outer surface of copper—Step (n).

Typically, the thinning process of step (m) is selected from the list comprising dry etching, mechanical grinding, chemical mechanical polishing (CMP) and combinations thereof.

Most typically, the thinning process of step (m) comprises dry etching followed by chemical mechanical polishing.

Typically, the insulating material of Step (IV) comprises an epoxy and the post thinning cleaning process of step (n) comprises at least one technique selected from the list of: (i) applying a potassium permanganate solution at a concentration of between 55 and 75 grams per liter of $KMnO_4$ at a temperature of between 70° C. to 95° C., and (ii) a plasma dry etch process.

Optionally, step V of depositing a second barrier metal layer comprises the following substeps: Depositing a second barrier metal layer—step (o), and Depositing a copper seed layer onto the second barrier layer—step (p).

Typically, the second barrier metal layer is selected from the list comprising: tantalum, tungsten, titanium, titanium-tungsten and titanium-tantalum.

Typically, the second barrier metal layer has a thickness in the range of between 0.1 micron and 1 micron.

Typically, the step of depositing (p) comprises a physical vapor deposition process, such as sputtering.

Optionally, step VI of depositing a feature layer comprises the substeps of: Applying a fourth layer of photoresist and developing the fourth layer of photoresist to selectively expose the copper seed layer—step (q); Pattern electroplating a copper conductor layer into the fourth layer of photoresist—step (r), and Stripping away the fourth layer of photoresist—step (s).

Optionally, step VII of depositing a second via layer comprises the following substeps: Applying and developing a fifth layer of photoresist to form a fifth pattern—step (t); Depositing copper therein to form a second layer of vias—step (u); Stripping away the fifth layer of photoresist—step (v), and Removing exposed copper seed layer and adhesion/barrier metal layers—Step (w).

Typically, step VIII of surrounding the copper features and vias with an insulating material comprises the following substeps: Laminating a second insulating layer over the exposed copper features and vias—step (x); Thinning down the insulating layer by a thinning process to expose the copper substructure therebeneath-Step (y), and Cleaning to remove polymer smear and debris from thinning process—step (z).

Typically, step VIII of applying a third layer of copper features comprises the steps of: Depositing a third barrier metal layer—step (aa); Depositing a copper seed layer onto the third barrier metal layer—step (ab); Applying and developing a sixth layer of photoresist to form a sixth pattern—step (ac); Pattern plating a third layer of copper features therewithin—step (ad); Stripping away sixth layer of photoresist—step (ae), and Removing exposed copper seed layer and adhesion/barrier metal layers—step (af).

Typically, the third barrier metal layer is selected from the list comprising: tantalum, tungsten, titanium, titanium-tungsten and titanium-tantalum.

Typically, the third barrier metal layer has a thickness in the range of from 0.1 micron to 1 micron.

Optionally, the step of depositing (ab) comprises a physical vapor deposition process, such as sputtering, for example.

Optionally, step X of terminating comprises the steps of: Applying a layer of soldermask over and around the third layer of copper features and developing a pattern of terminations—step (ag), and Plating Ni/Au into the pattern of terminations to provide terminations for wirebonding—step (ah).

Optionally, the step (ah) of plating Ni/Au is by a technique selected from the list comprising electroplating and electroless plating.

Optionally, step XI of forming a cavity in the underside of the structure comprises the steps of: Applying a layer of photoresist over the underside of the copper base layer and developing to expose the copper opposite central copper region—step (ai); Etching away the exposed copper by a wet etch process—step (aj), and Removing the barrier metal layers—step (ak).

Optionally, step XII of terminating the contacts within the cavity comprises the steps of: Applying a layer of solder mask in place of the removed second barrier layer and developing the solder mask layer to expose part of the copper features—step (al), and Depositing metal terminations into the solder mask and onto the exposed copper features (am).

Optionally, step XIII of terminating the multilayered structure comprises the steps of: Removing photoresist—step (an), and Etching away remains of copper base (ao).

Typically, the copper base having a thickness in the range of 75 μm to 600 μm.

Typically, at least one insulating layer comprises a composite material having a polymeric matrix with fiber reinforcement.

Most typically, the polymeric matrix further comprises a particle filler.

A second aspect of the invention is directed to providing a cavity IC support fabricated by the method of: Selecting a copper base—Step (a); (I) Applying a barrier metal layer; (II) Applying a first feature layer; (III) Applying a first layer of vias; (IV) Applying a first layer of insulating material around the copper features and vias; (V) Applying a second barrier metal layer; (VI) Applying a second layer of copper features; (VII) Applying a second layer of vias; (VIII) Applying a second layer of insulating material around the copper features and vias; (IX) Applying a third layer of copper features to form a multilayered structure; (X) Applying terminations on upper surface of the multilayered structure; (XI) Forming a cavity in the underside of the multilayered structure; (XII) Terminating contacts in the cavity, and (XIII) Etching away the remainder of the copper base and (XIV) Terminating the exposed conduits.

The cavity IC support may be used for supporting a first IC die connected in series with a second IC die, wherein the IC support comprises a stack of alternating layers of copper features and vias in an insulating surround, the first IC die being bondable onto the IC support, and the second IC die being bondable within a cavity inside the IC support.

Typically, the insulating surround comprises a composite material having a polymeric matrix having particulate filler and fiber reinforcement.

Typically, the IC support has a thickness of not more than 400 microns.

Typically, the IC support is less than 15 mm×15 mm in area.

Typically, the IC support includes a cavity that is at least 8 mm×8 mm and has a depth of 100 microns.

In various embodiments, the dimensions will vary widely.

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice.

In particular, it will be noted that the cross sections of the various layers and stacks are schematic illustrations only and are not to scale, with thicknesses being greatly exaggerated. Also, the substrates and fabrication techniques described herein are applicable to a large number of end products, and no attempt has been made to show the structure of the conductive features within each layer.

Figure 1:
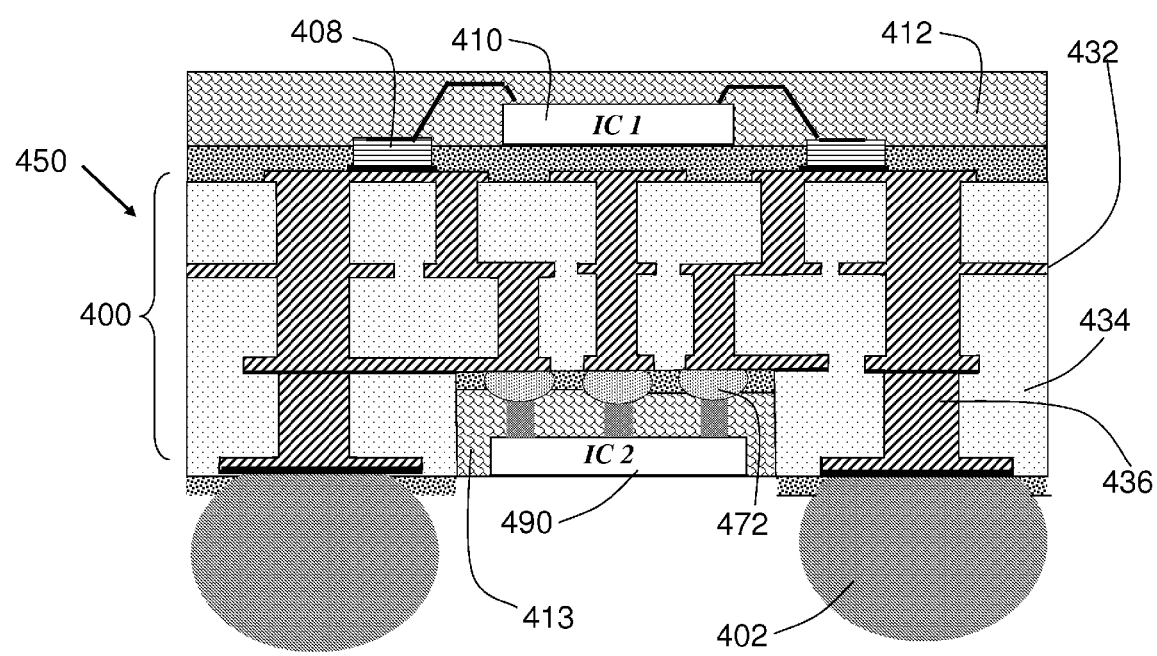
Figure 2:
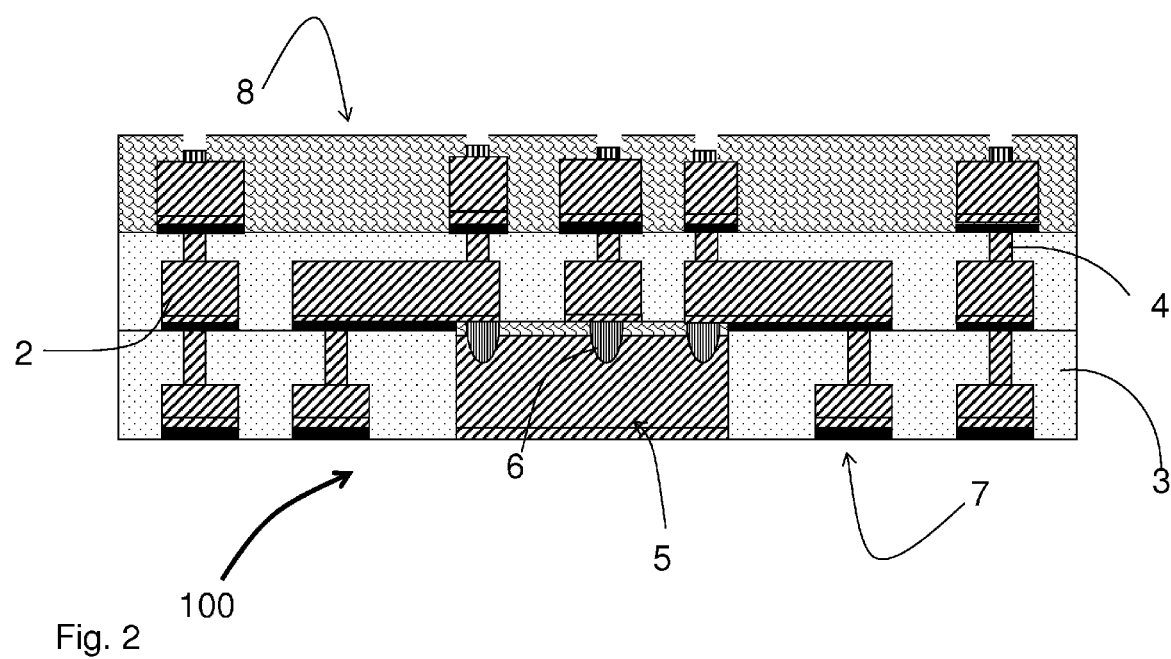
Figure 3A:
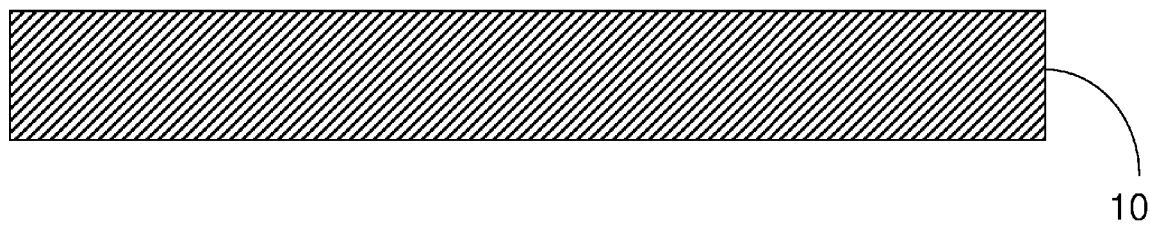
Figure 3B:
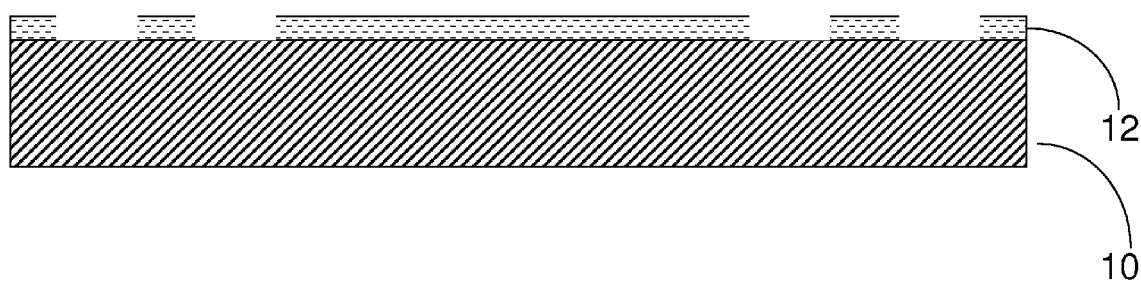
Figure 3C:
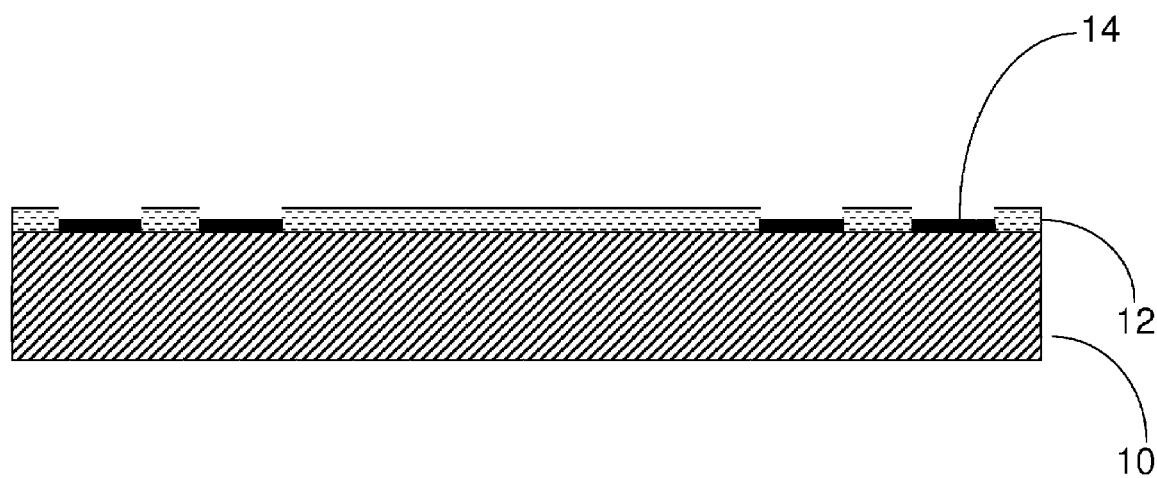
Figure 3D:
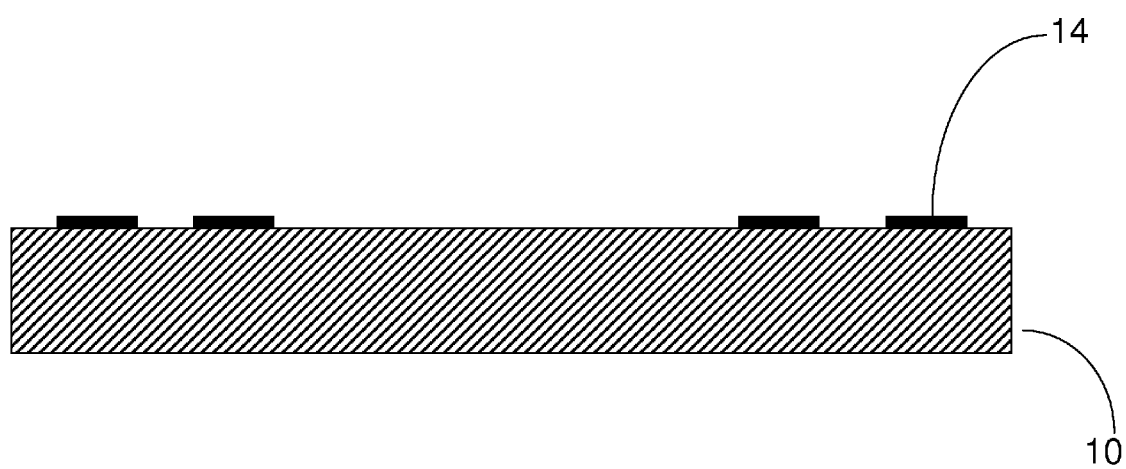
Figure 3E:
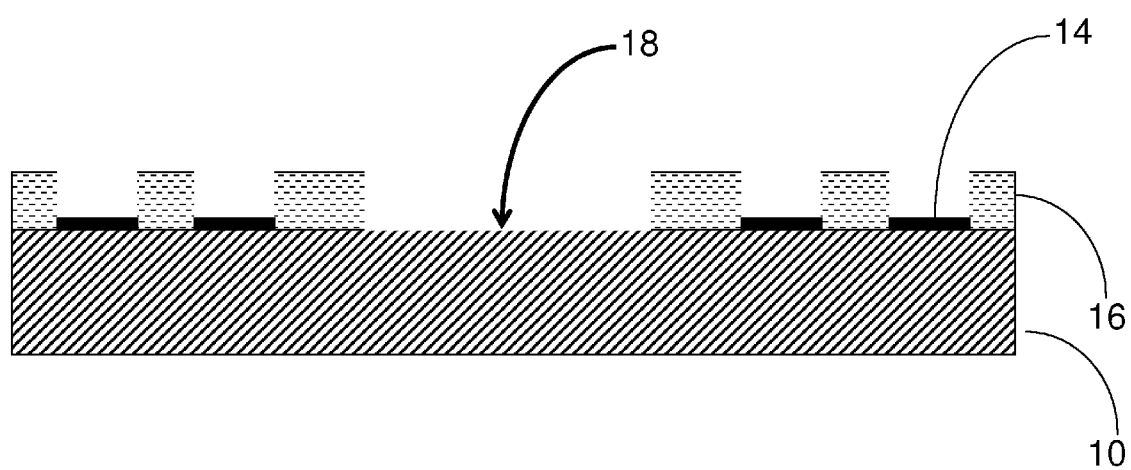
Figure 3F:
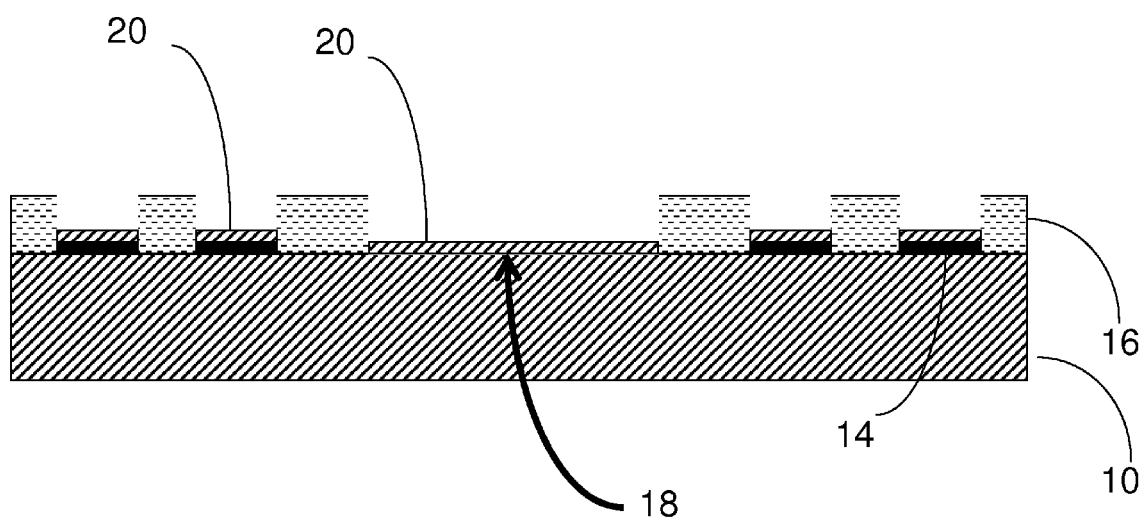
Figure 3G:
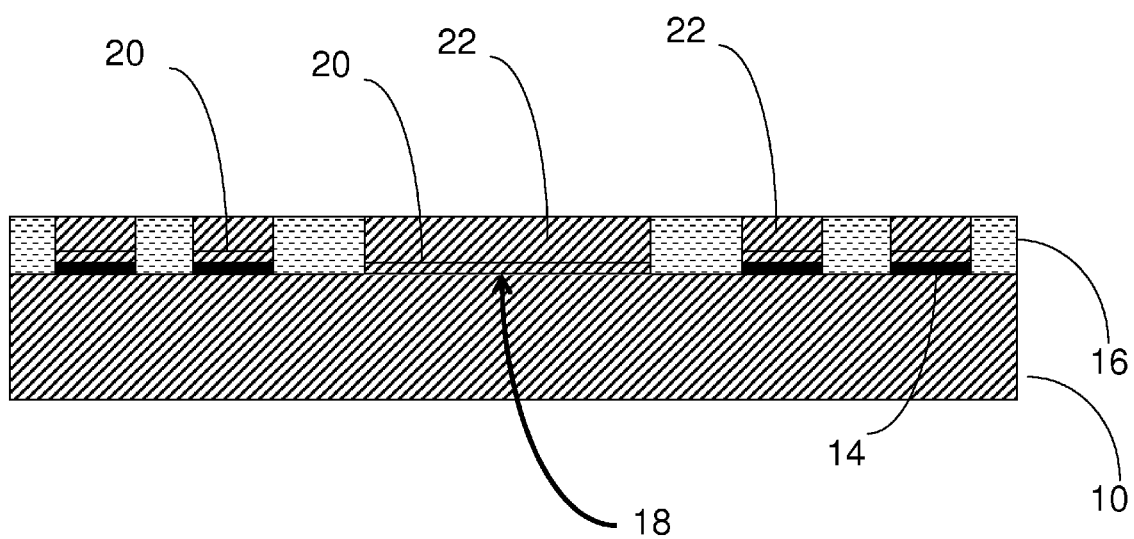
Figure 3H:
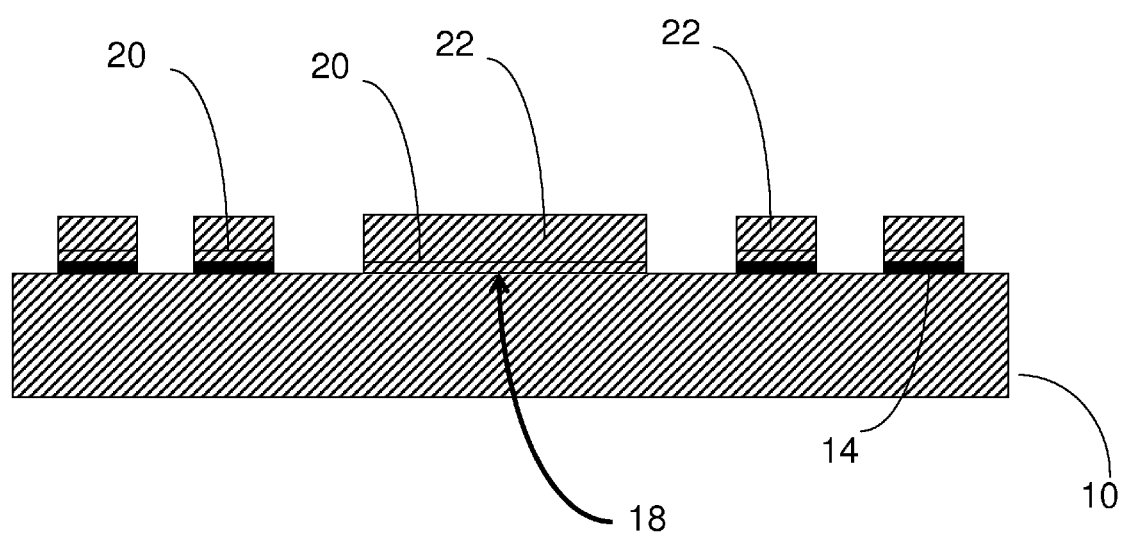
Figure 3I:
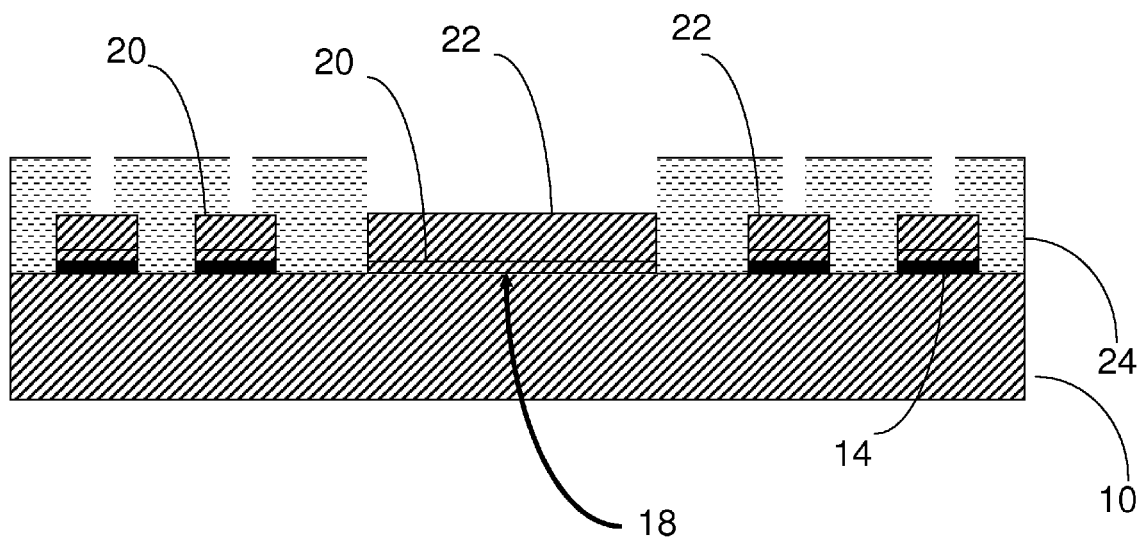
Figure 3J:
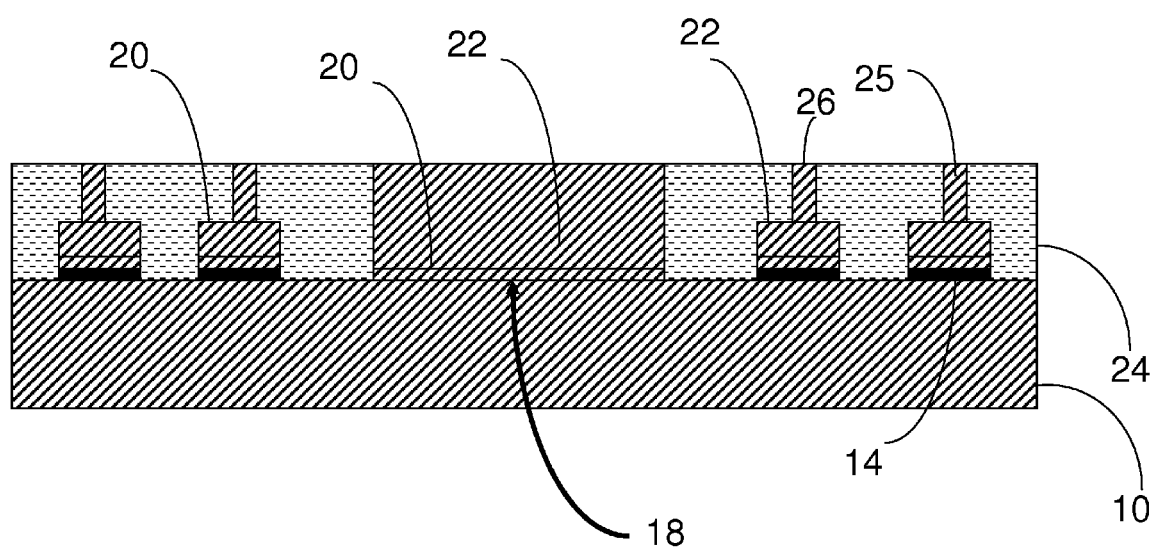
Figure 3K:
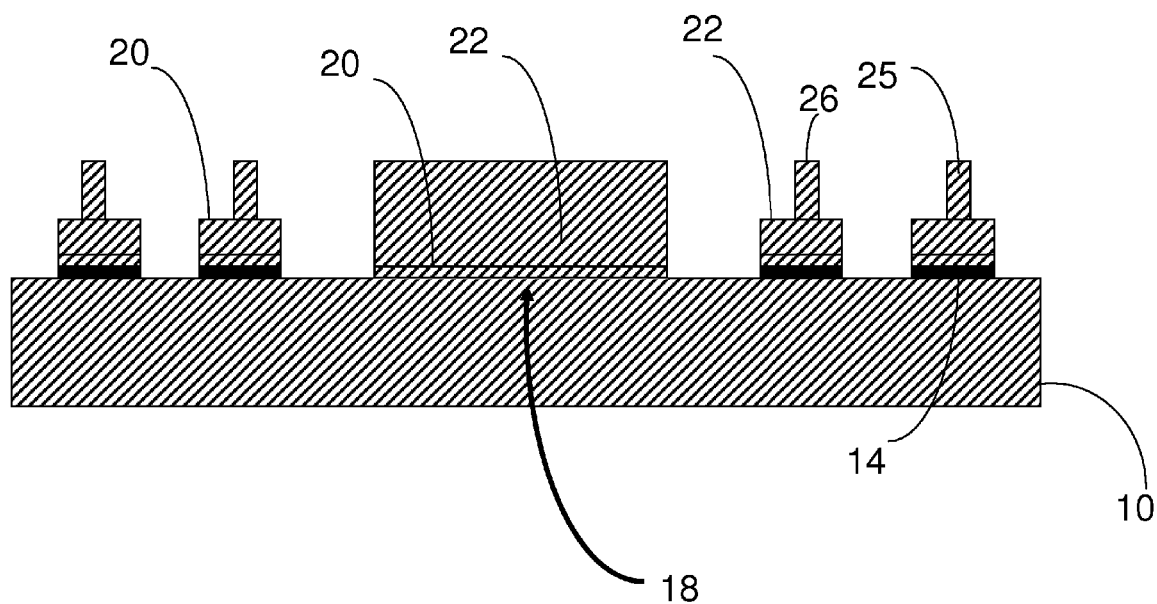
Figure 3L:
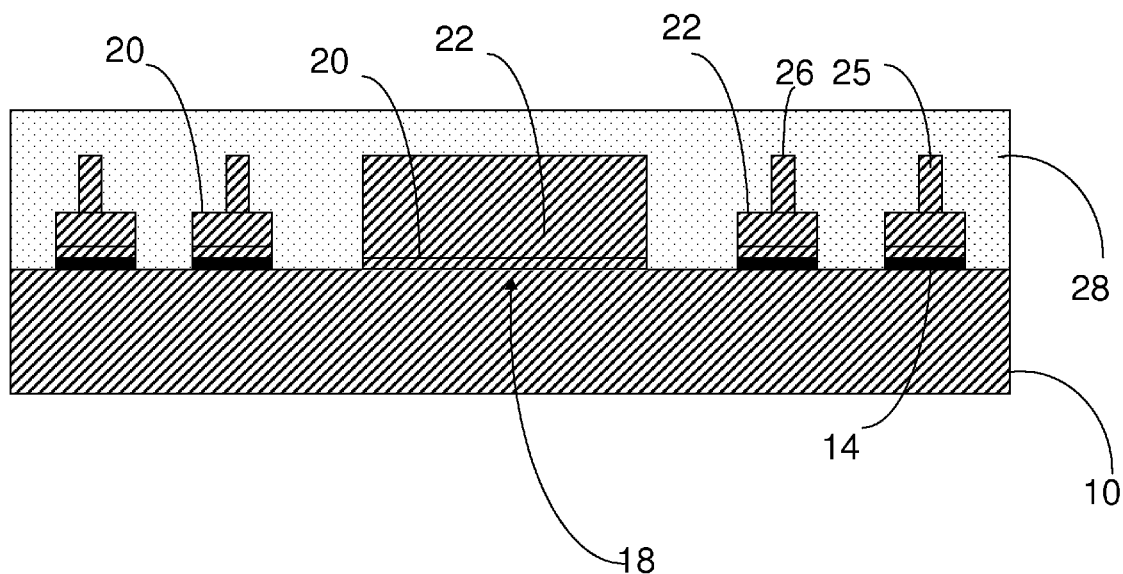
Figure 3M:
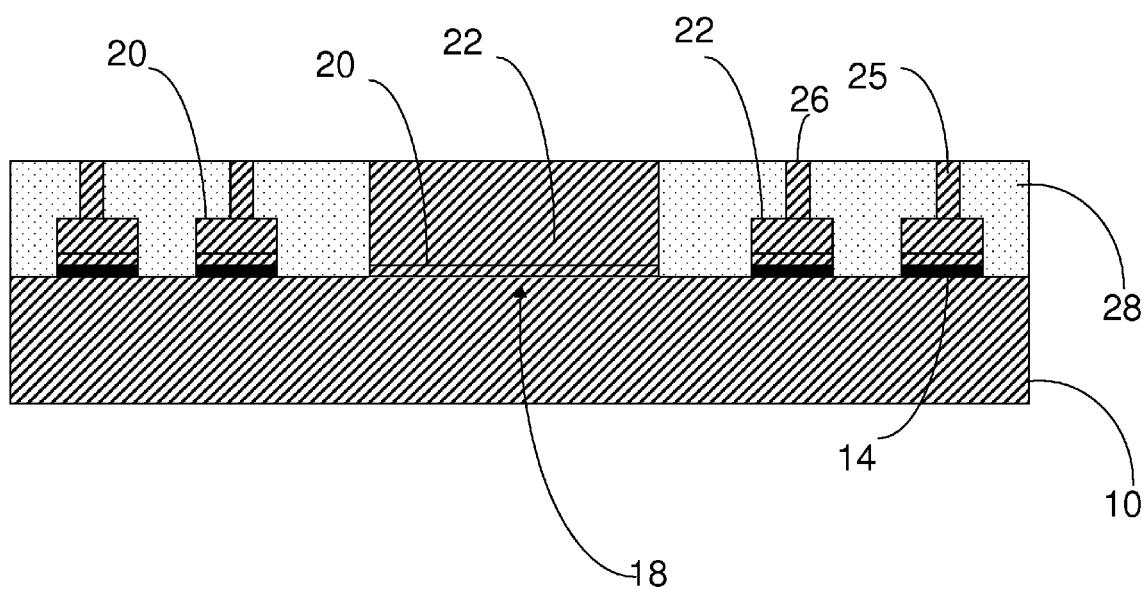
Figure 3O:
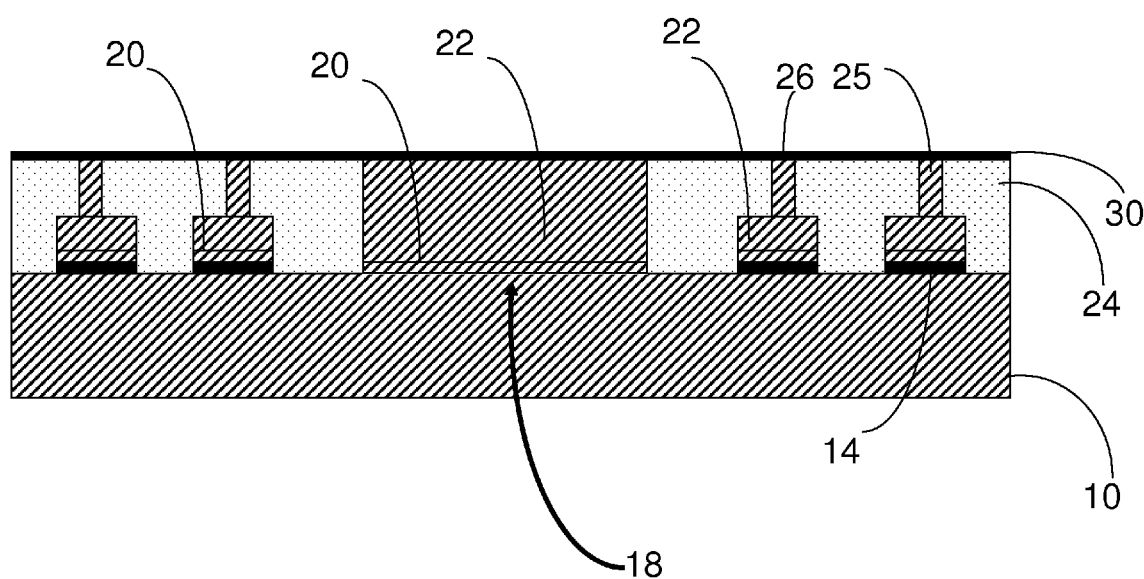
Figure 3P:
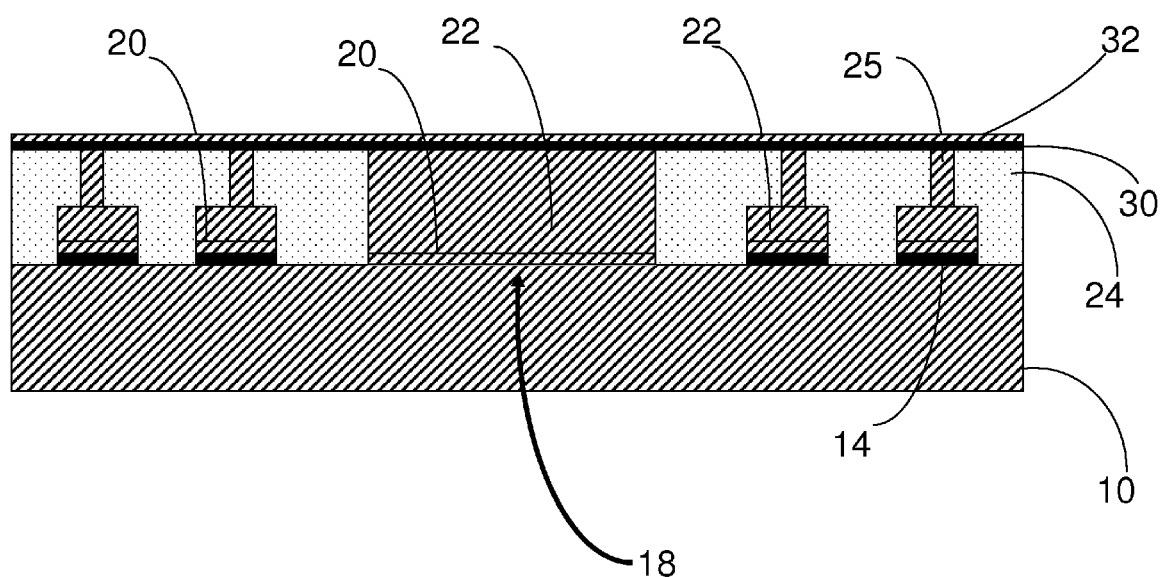
Figure 3Q:
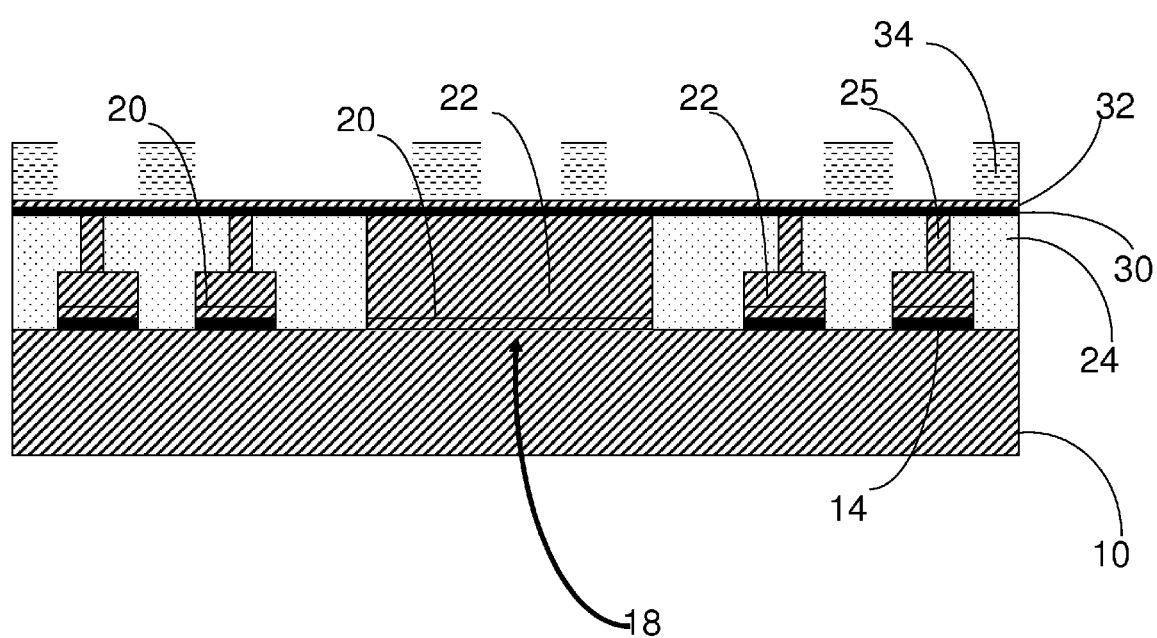
Figure 3R:
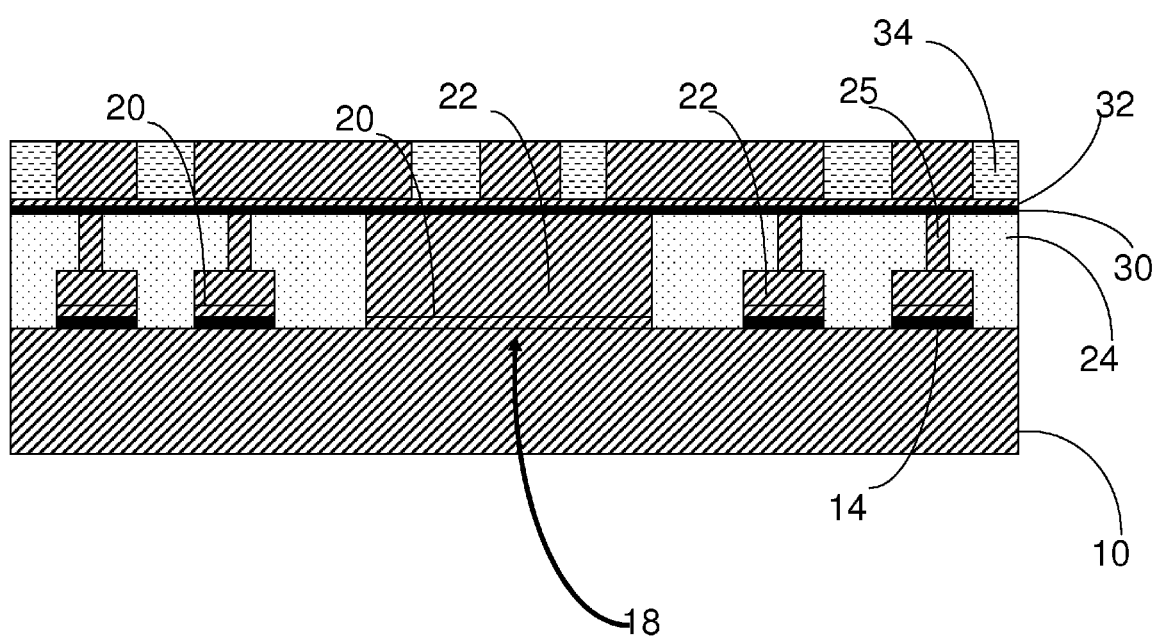
Figure 3S:
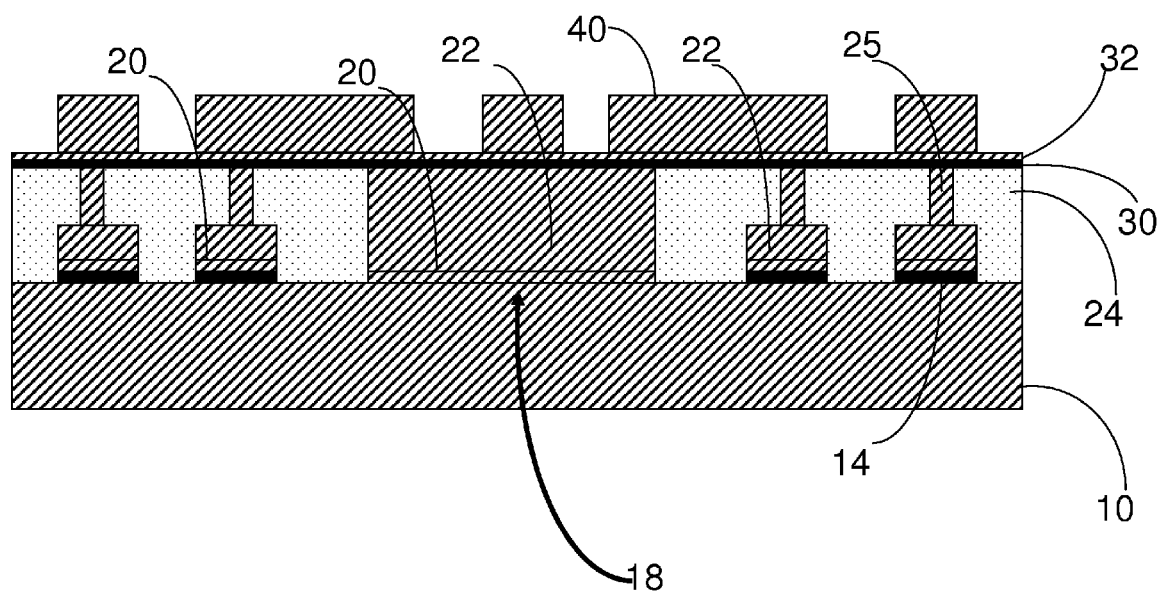
Figure 3T:
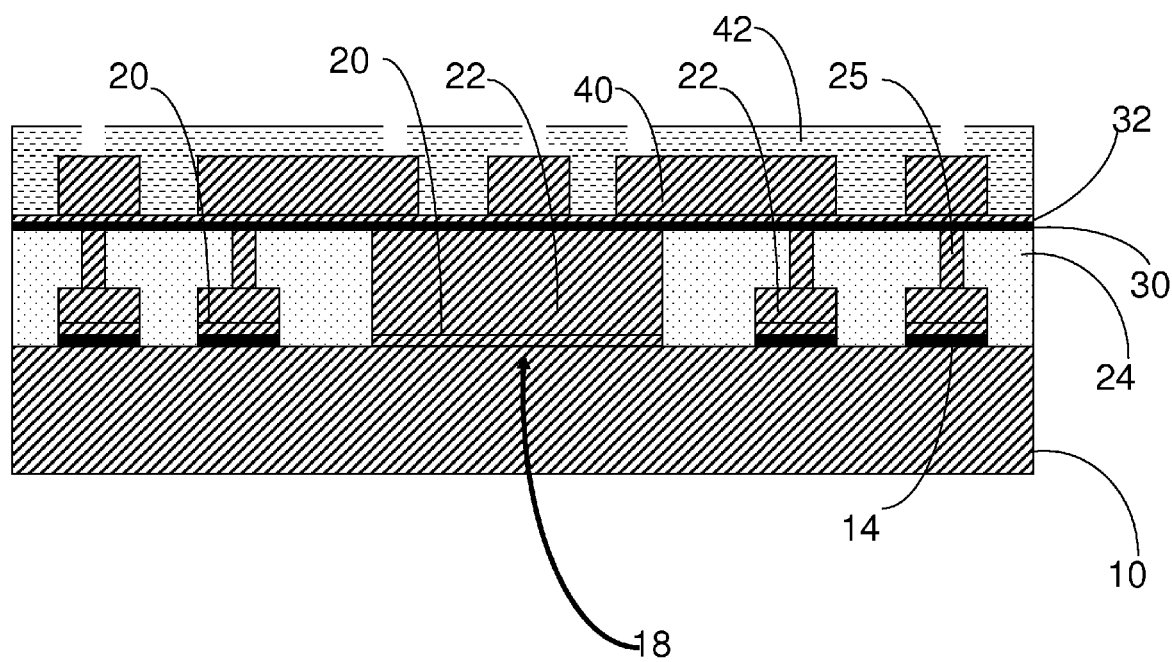
Figure 3U:
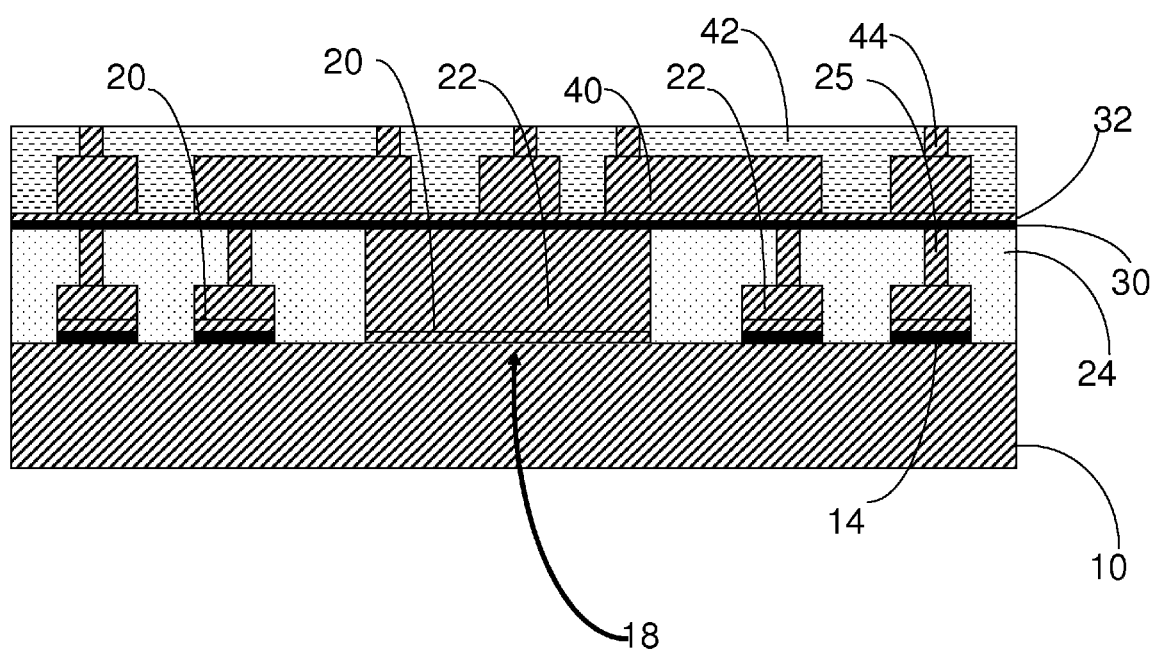
Figure 3V:
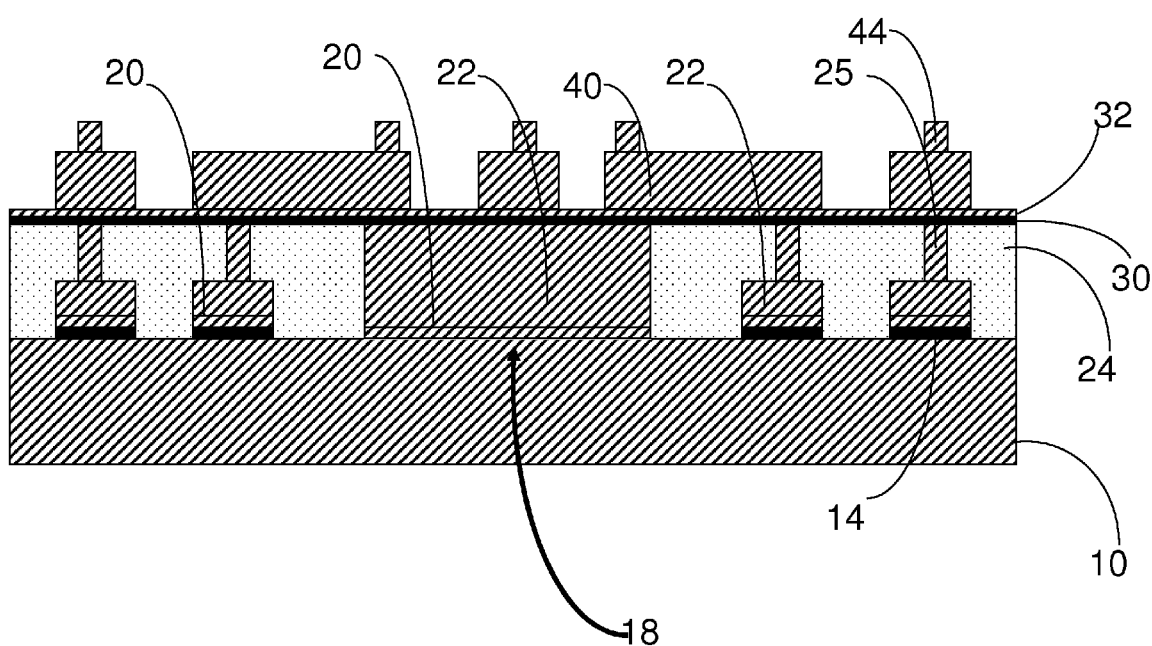
Figure 3W:
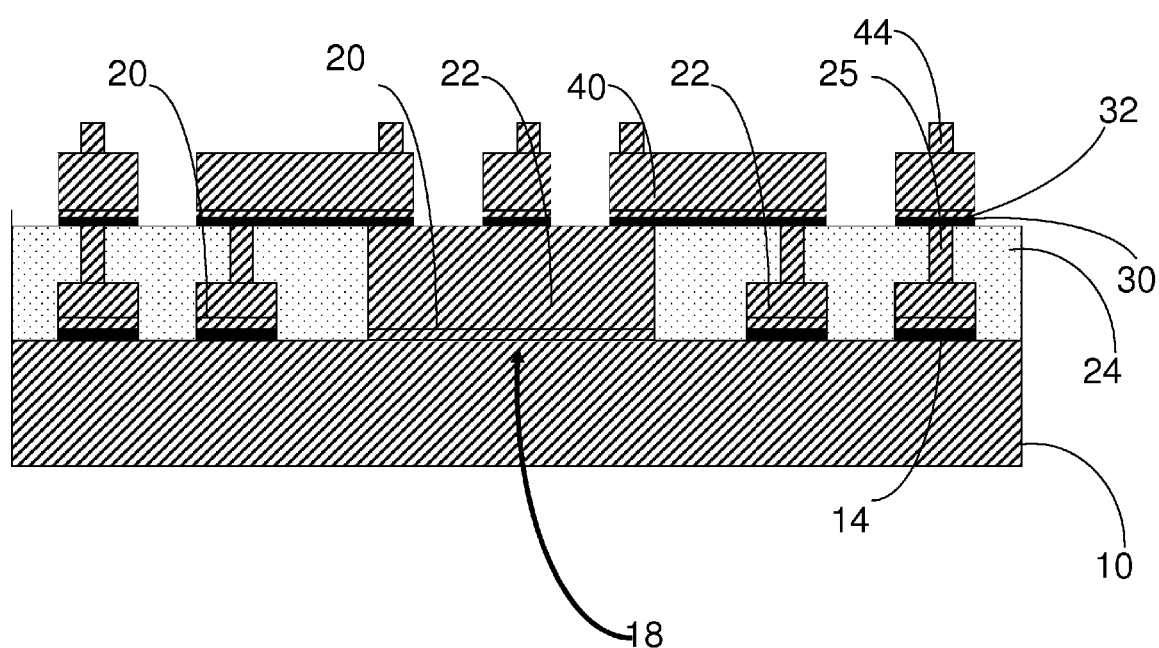
Figure 3X:
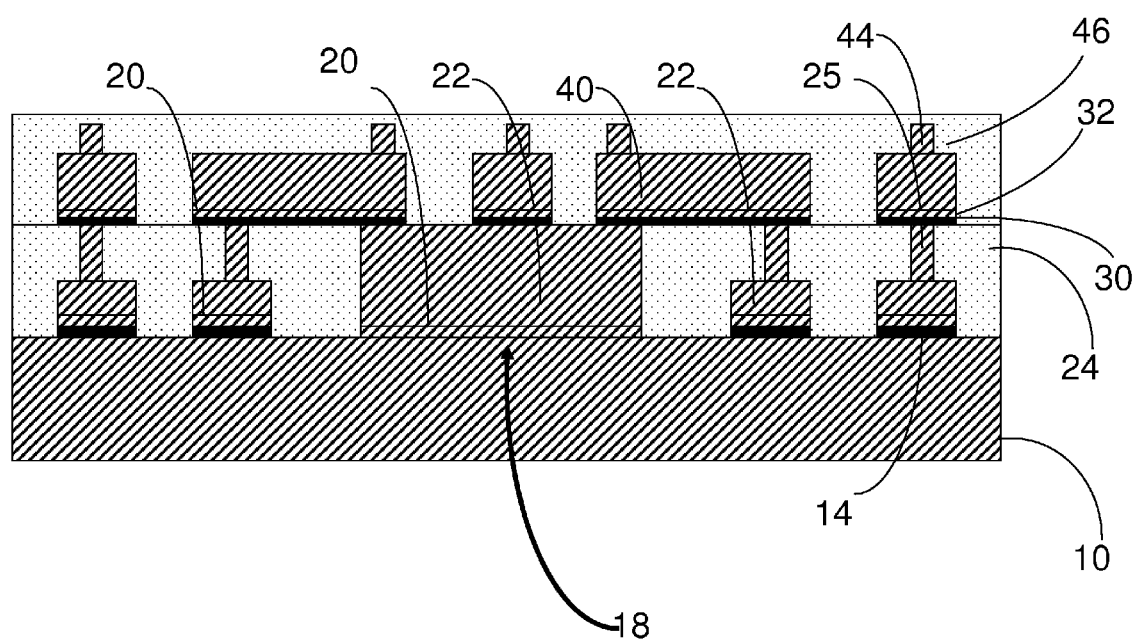
Figure 3Y:
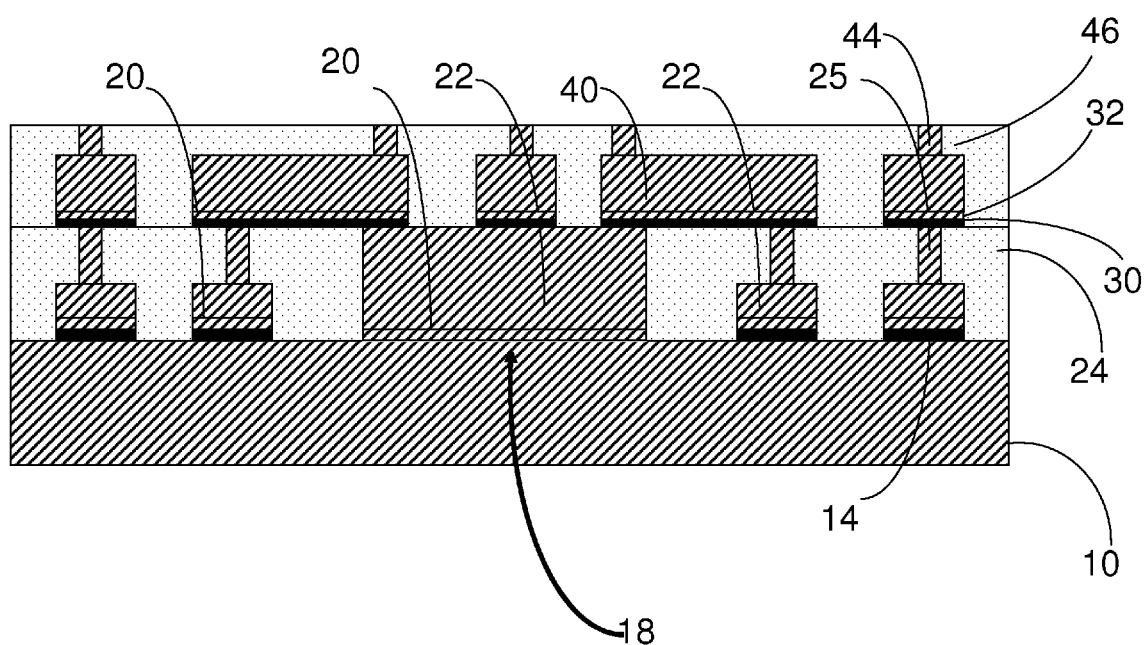
Figure 3:
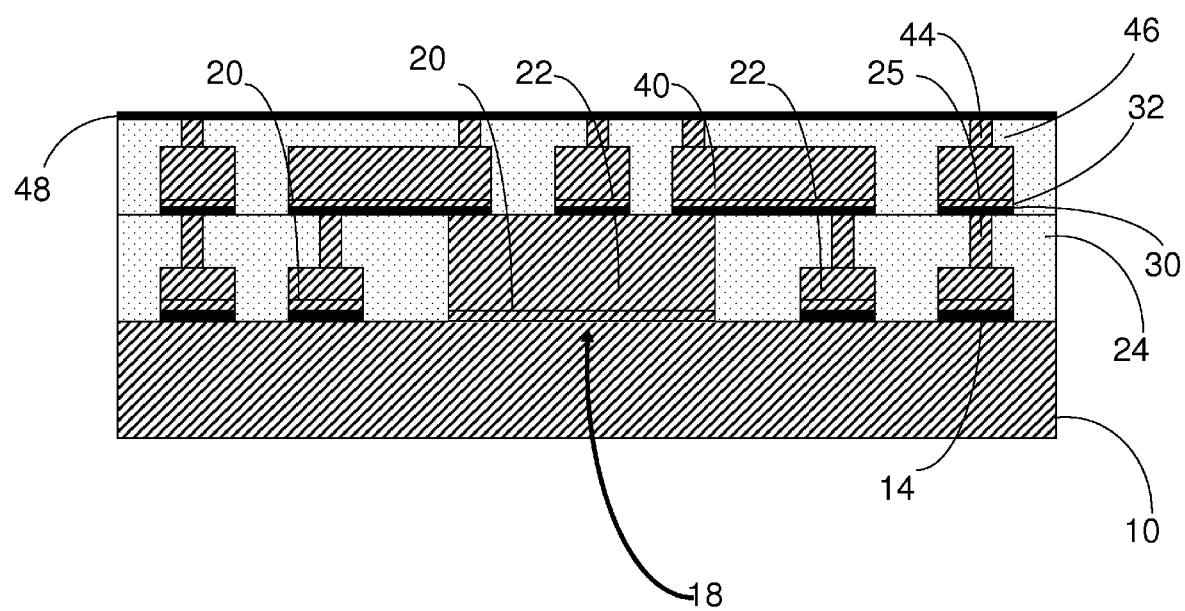
Figure 3:
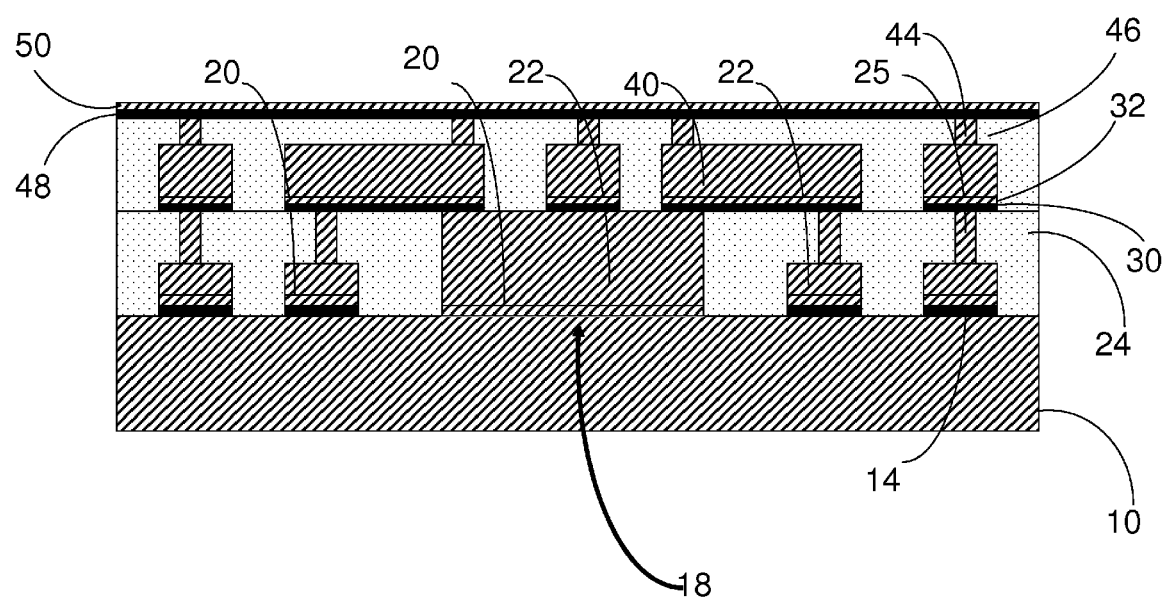
Figure 3:
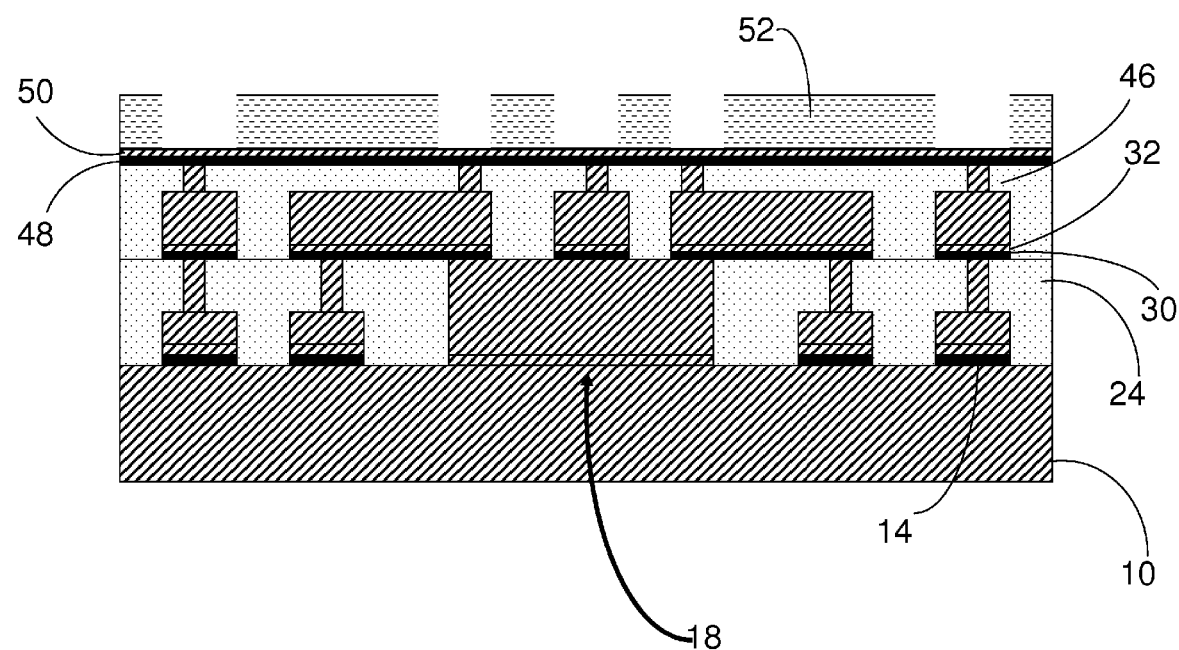
Figure 3:
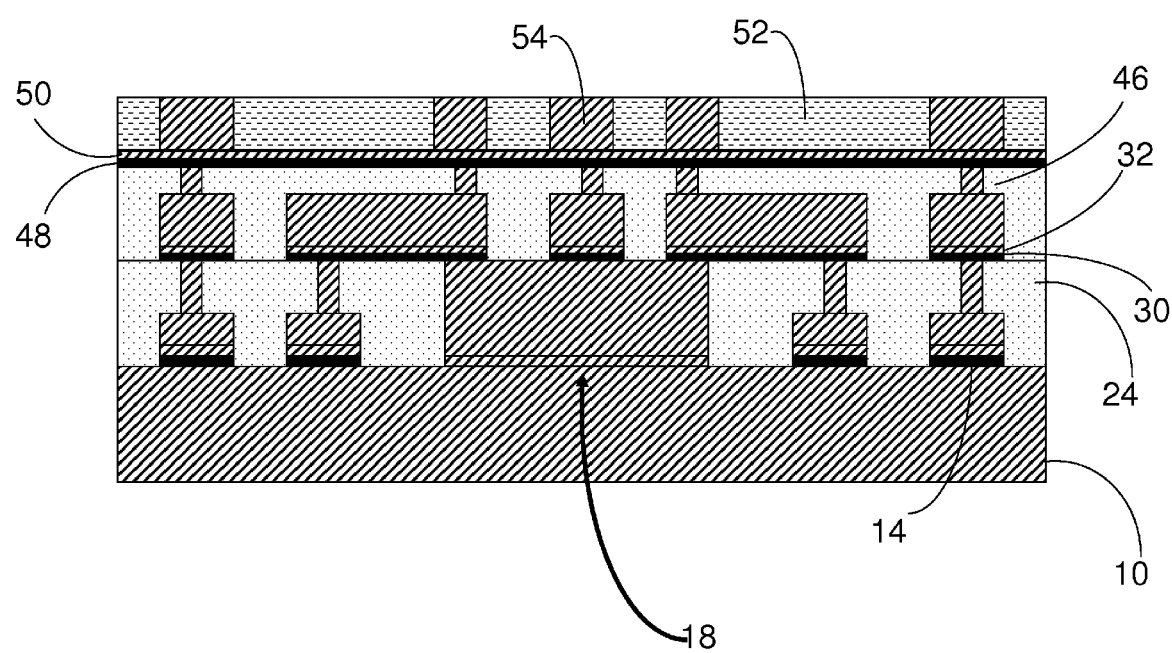
Figure 3:
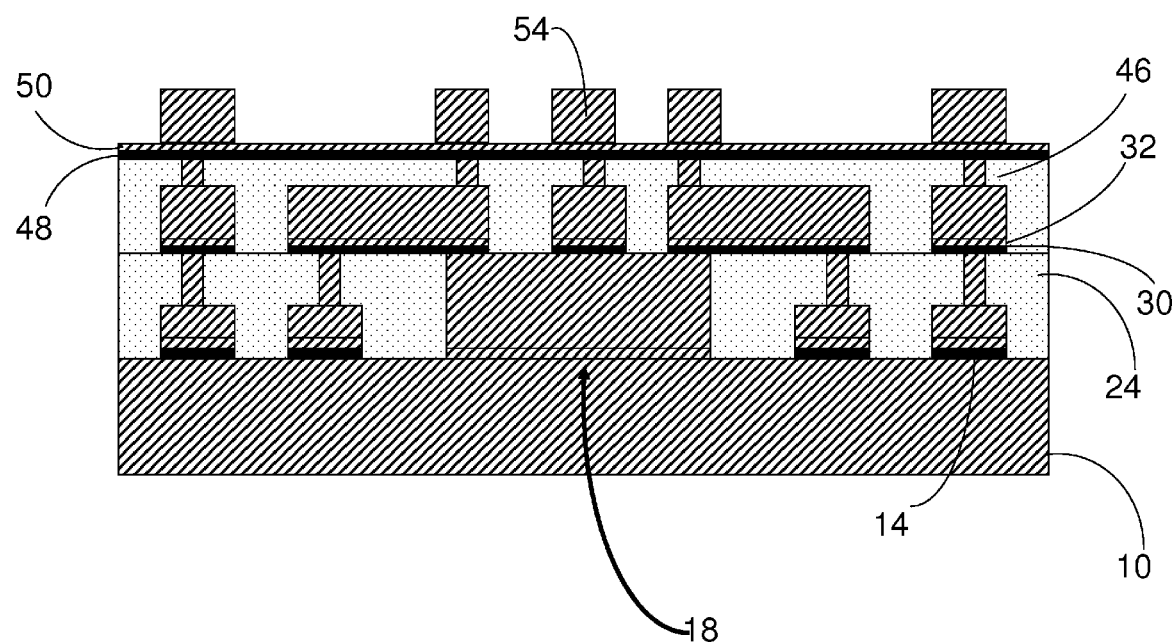
Figure 3:
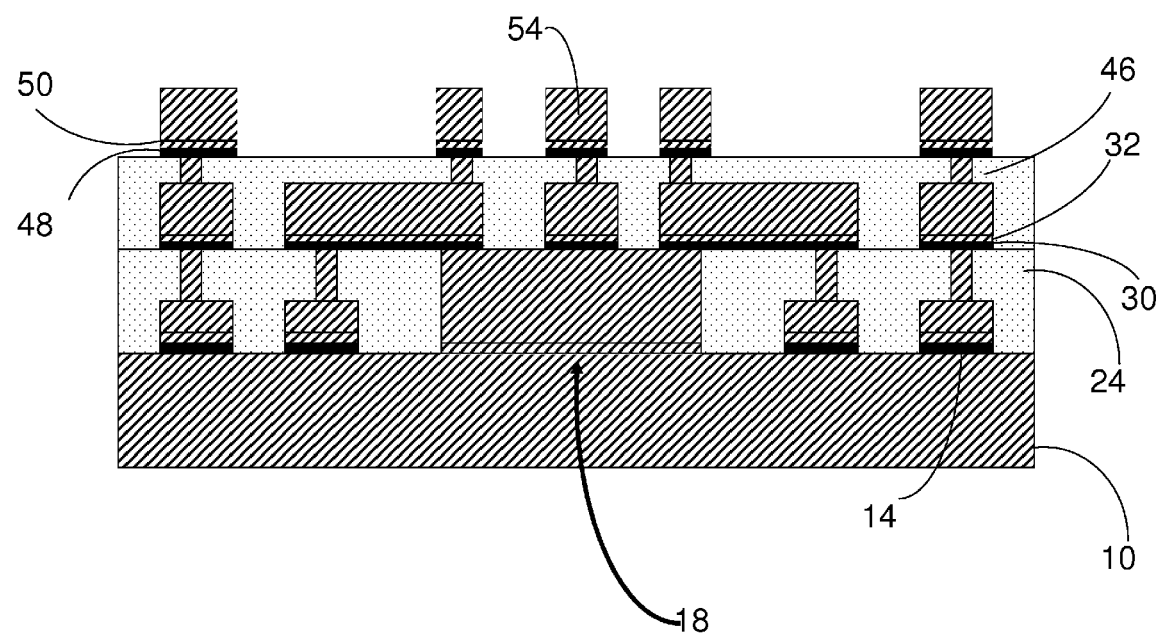
Figure 3:
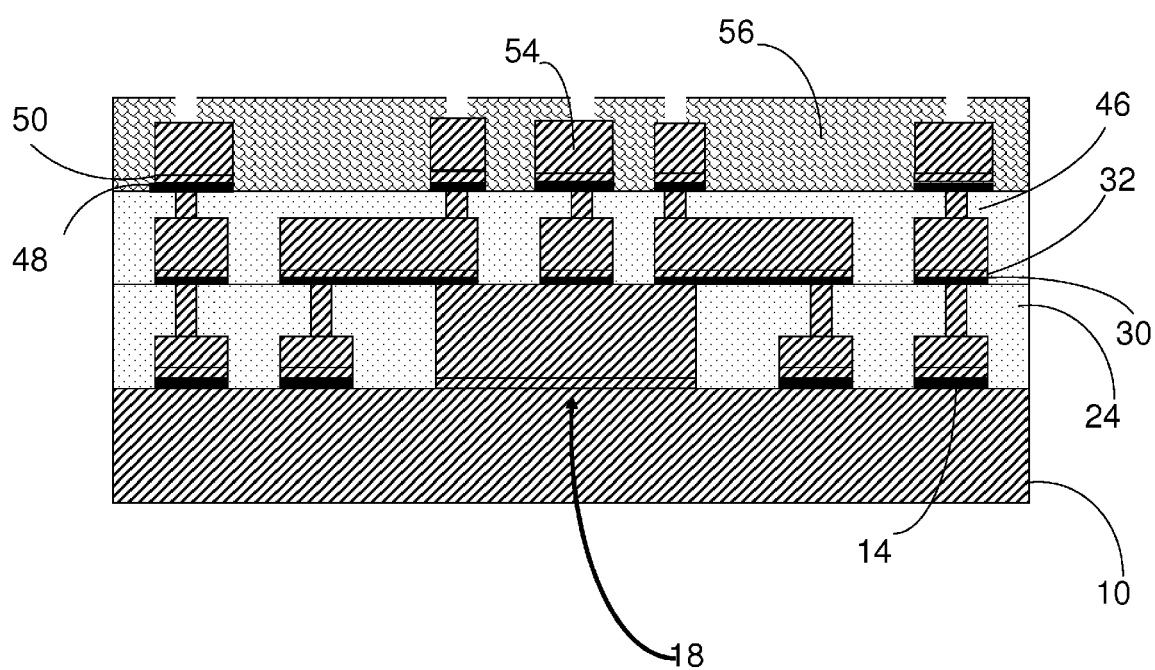
Figure 3:
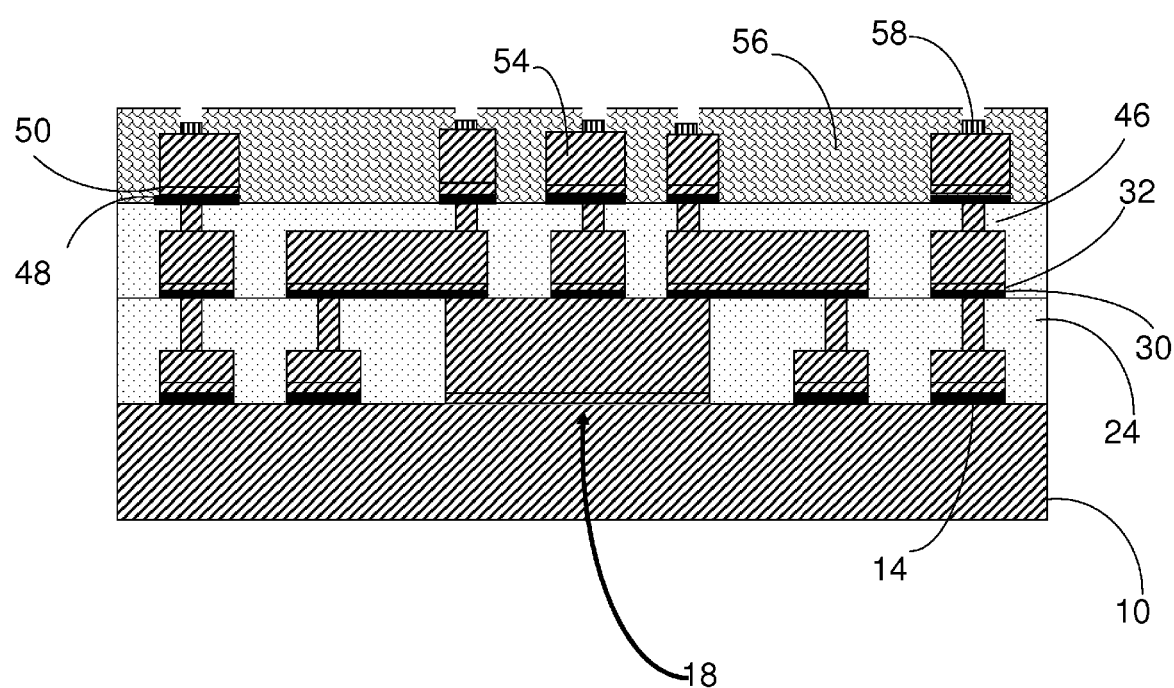
Figure 3:
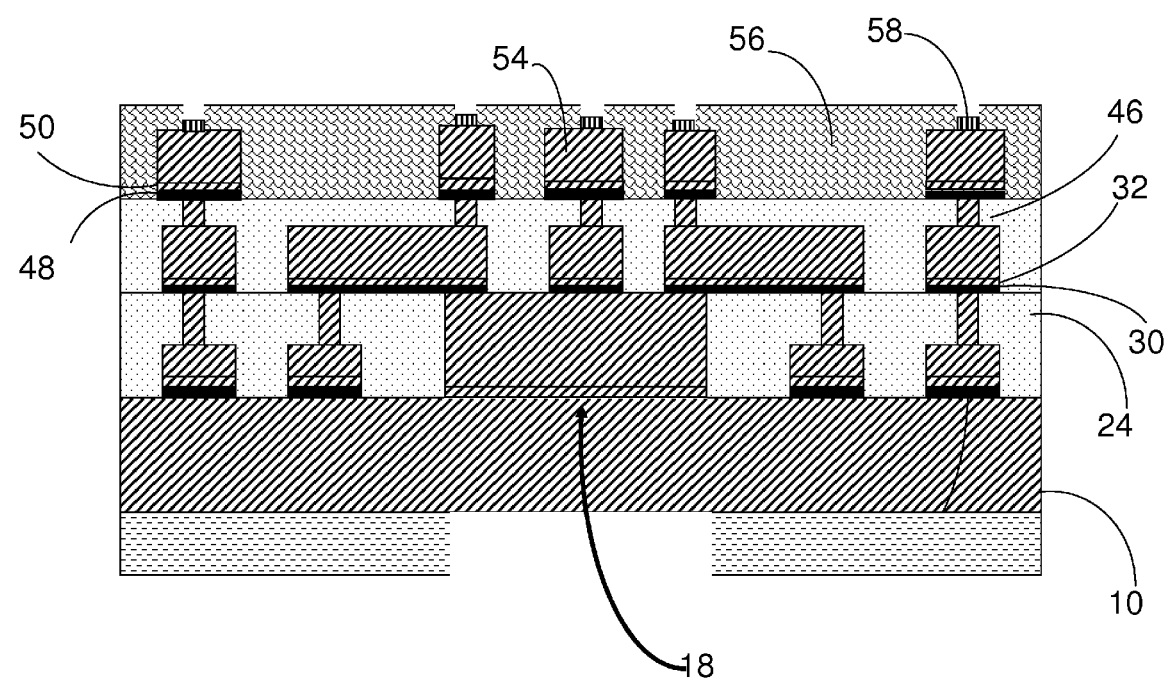
Figure 3:
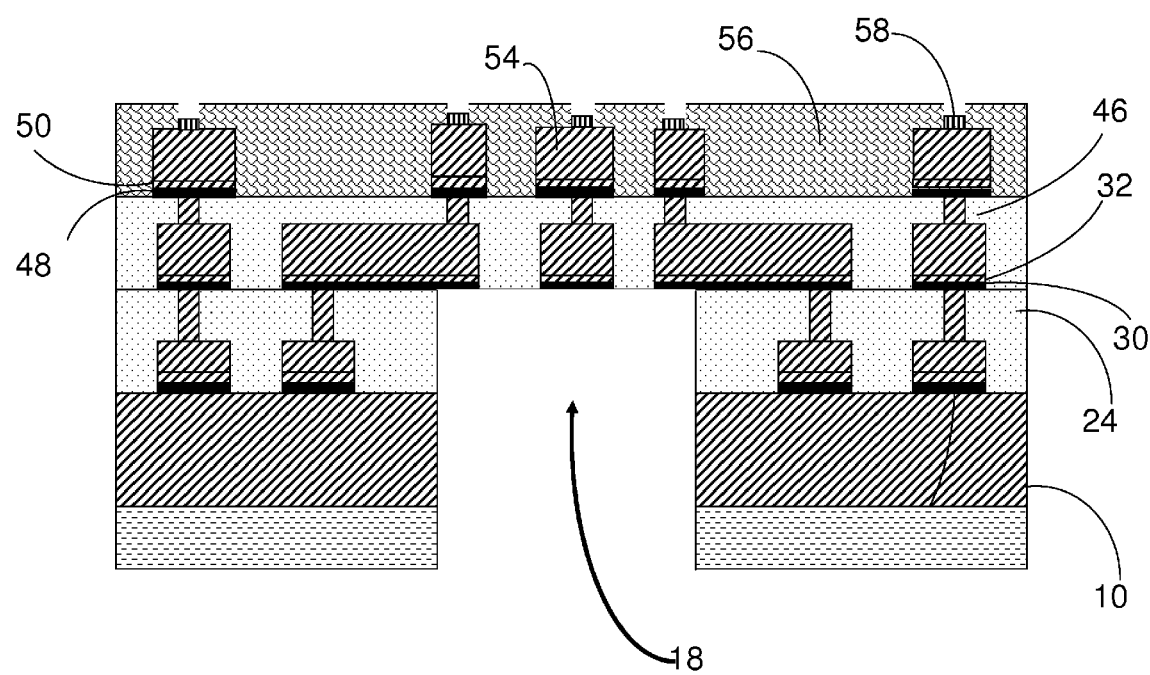
Figure 3:
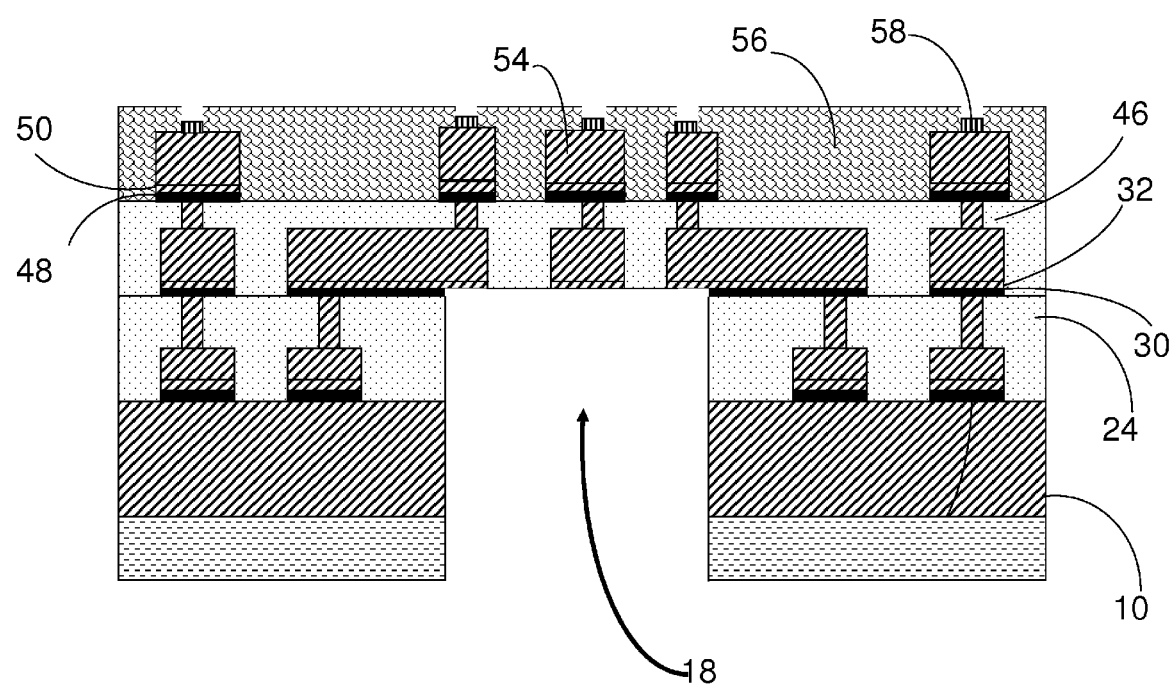
Figure 3:
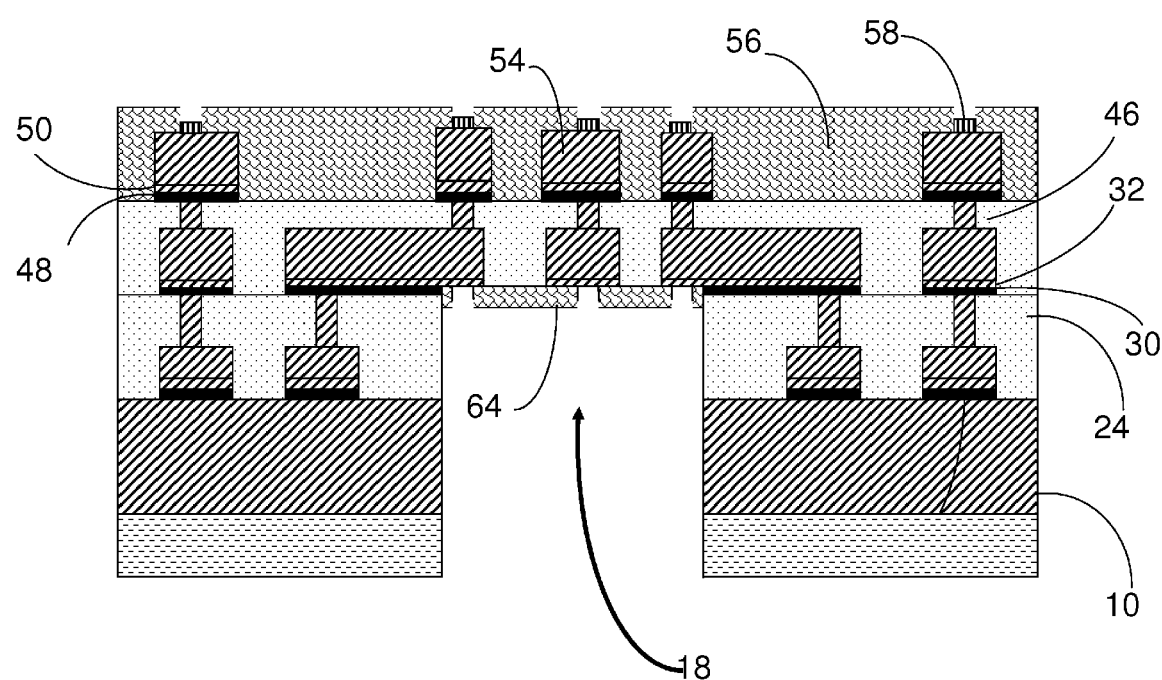
Figure 3:
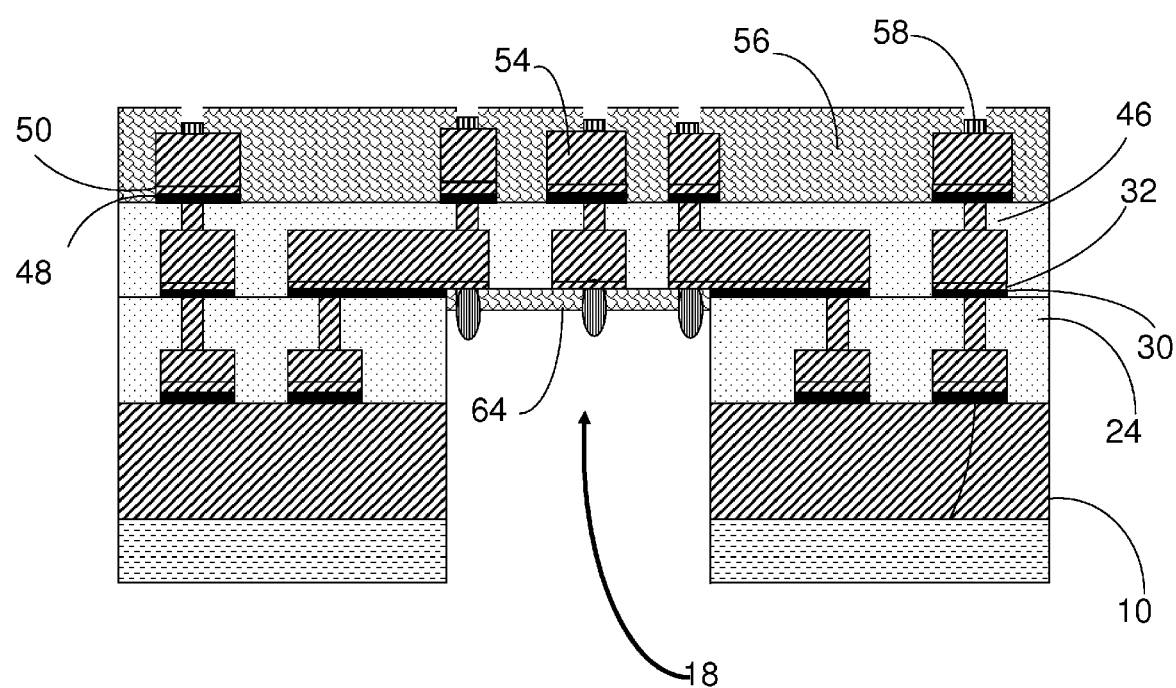
Figure 3:
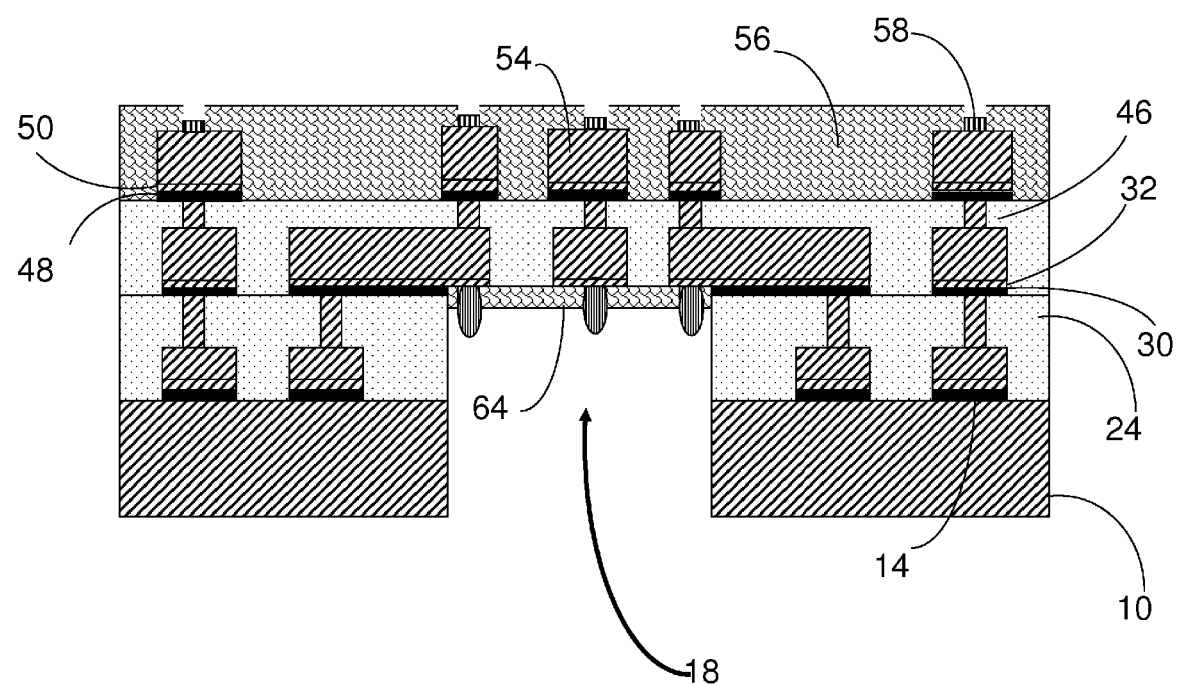
Figure 3:
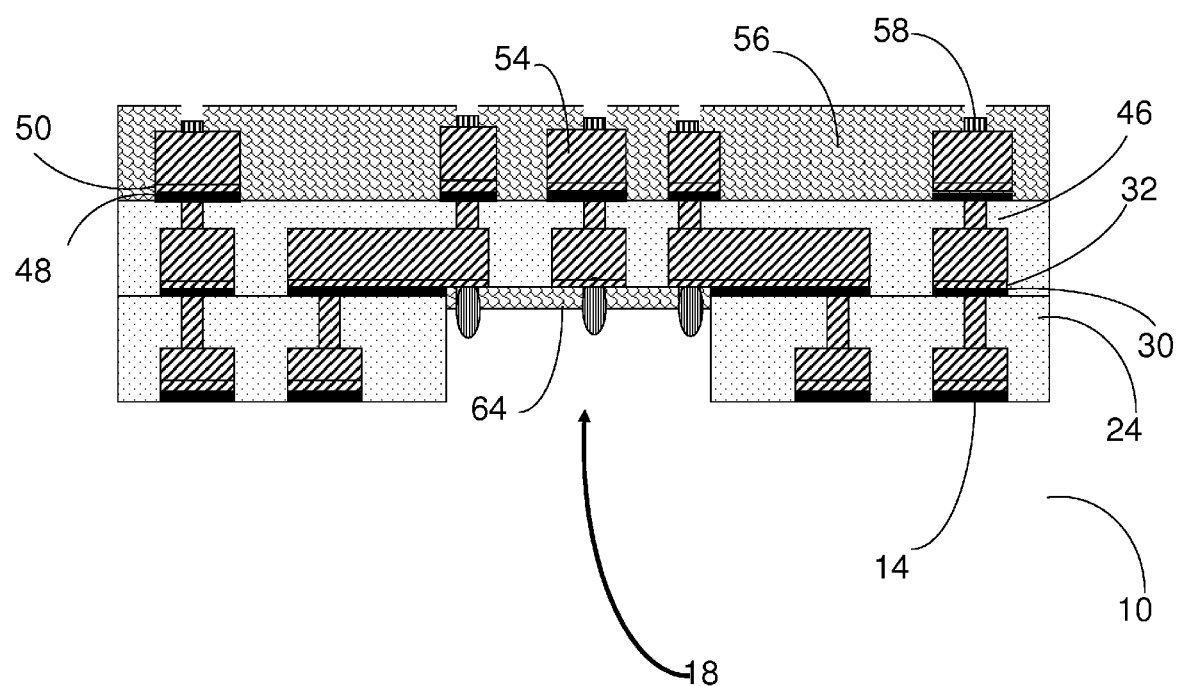

In the accompanying drawings:

FIG. 1 is a schematic cross section through a coreless, cavity IC support substrate in accordance with a preferred embodiment of the present invention, supporting a first IC die in the cavity thereof and a second IC die on a surface thereof;

FIG. 2 is a schematic cross section through the basic structure of the cavity IC support substrate of FIG. 1;

FIG. 3 is a flowchart showing the processing steps of one fabrication technique for fabricating the coreless IC support substrate of FIG. 1;

FIGS. 3(*a*) to 3(*ao*) schematically illustrate the intermediate structures produced by the steps 3(*a*) to 3(*ao*) of FIG. 3.

DESCRIPTION OF THE PREFERRED EMBODIMENTS

With reference to FIG. 1, the present invention relates to a compact, reliable packaging 450 for two IC chips 410, 490, and particularly to a coreless IC support substrate 400 having dimensions of, say, 14 mm×14 mm, and a thickness of less than 1 mm, and having a cavity therein of, say, 9 mm×9 mm×0.1 mm, such that a first IC 410, such as a memory die for example, may be wire bonded or otherwise attached to the Ni/Au terminations 408 on the top side of the IC support substrate 400 thus formed, and a second IC 490 may be connected within the cavity 480, by a ball grid array or a land grid array of solder bumps 472. Applying terminations such as solder balls 402, over outer vias 436 of the packaging support substrate 400 provides a compact packaging 450, which, by stacking one IC chip 410 onto the other 490, is space conserving, enabling further miniaturization of, for example, flash memory devices such as the so-called, disk-on-keys and MP3 devices, and mobile phones and the like. The above dimensions are by way of example, and may vary considerably between the various embodiments.

The IC support substrate 400 will typically consist of copper vias 436 and features 432 within an insulating surround 434 that is preferably a fiber reinforced composite material.

Instead of applying a second chip to the top surface 8 (FIG. 2) thereof, another cavity substrate may be build up to make a taller stack, or, indeed any other structure may be deposited thereupon.

As shown in FIG. 2, the basic structure of the support substrate 1 consists of alternating copper layers 2 and dielectric layers 3, with the copper layers 2 being connected by copper vias 4 that pass through the dielectric layers 3. A cavity 5 is provided within the support substrate 1. Cavity 5 is terminated with terminations 6 for connecting an IC or other electronic component therewithin. Such a support substrate 1 may be mounted, cavity 5 side up or cavity 5 side down, and further layers may be built up onto the surface 7 of the cavity surround or onto the opposite surface 8, to form package on package (POP), package in package (PIP) and multilayer stacks.

With reference now to FIG. 3, a novel processing method for manufacturing the coreless, cavity IC support substrate 400 described hereinabove is now described. Some of the fabrication steps, such as the steps of applying photoresist, its exposure and subsequent removal are not described herein in any detail since the various alternative materials and processing routes are well known, and their detailing will render this description unnecessarily cumbersome. Suffice to say, when designing a specific process for a specific product, persons of the art will make appropriate selections from the various alternative materials and processing routes using well established considerations based on parameters such as batch size, substrate complexity and component resolution. Furthermore, the actual architecture of the substrate is not described since a general method is provided that may be used to produce a variety of end products. What is described hereinbelow is a method for fabricating multilayer substrates of alternating conductive layers interconnected by vias through insulating layers to provide a three dimensional stacked substrate.

It is a particular feature of the manufacturing technique described hereinbelow, that the entire structure including the cavity and the vias are manufactured without mechanical tooling or laser tooling. Since many vias may be fabricated in parallel, the manufacturing technique is particularly economical and suitable for mass production. Obviously, where an array of such cavity packages are manufactured at one time, the individual packages will be separated by dicing. Nevertheless, expensive and inefficient discontinuous drilling and micromilling processes are eliminated. It is another particular feature of the manufacturing technique described hereinbelow, that the entire substrate structure may include solid copper vias of widely varying sizes and shapes. Amongst other advantages that will be apparent to the person of the art, it will be appreciated that this that can assist in dissipating the heat generated by the ICs assembled in and/or on the substrate.

FIG. 3 is a generalized flowchart showing the steps of a processing method for fabricating substrates of this type, and FIGS. 3(a) to 3(ao) show schematically the build up of the substrate in accordance with the steps of FIG. 3.

Thus with reference to FIGS. 3 and 3(a) to 3(ao), a first processing method for fabricating electronic substrates is shown, together with schematic illustrations of the intermediate structures thus formed. The method comprises the steps of: selecting a copper base 10—Step (a). Copper base 10 typically has a thickness in the range of 75 µm to 600 µm for ease of handling and processing, but the actual thickness is not critical as the entire base 10 will eventually be etched away. A barrier metal layer 14 is applied (I). This is achieved by applying a first layer of photoresist 12 onto the copper base layer 10 and developing the photoresist layer 12 to form a first pattern—Step (b). Then the barrier layer 14, which may be nickel or gold, for example, is deposited into the pattern by pattern electroplating Step (c). The first layer of photoresist 12 is now stripped away—Step (d). Next, a first conductive feature layer 22 is applied (II). This may be accomplished by applying a second layer of photoresist 16, typically having a thickness in the range of 25 microns to 120 microns, for example, and developing a second pattern that exposes a central region 18 of the copper base layer 10 and the Ni/Au or other barrier metal layer 14—step (e). Now a copper seed layer 20 is deposited onto the barrier metal layer 14 and onto the central copper region 18—Step (f). The copper seed layer 20 typically has a thickness in the range of between, say, 0.2 Mm and 5 Mm. Next a copper feature layer 22 is built up thereupon by a deposition technique such as electroplating or electroless plating—Step (g). Then the second layer of photoresist 16 is stripped away—Step (h). Now a layer of vias 26 is formed (III). In one processing route, a third, thicker layer of photoresist 24 is applied and a third pattern is developed, thereby both exposing the central copper region 18 and creating narrow passageways through the photoresist 24 down to the features of the feature layer 22—Step (i). Copper is pattern plated—Step k) into the exposed photoresist 24 to build up the central copper region 18 and to create vias 25, 26 that connect to the features of the feature layer 20. The photoresist 24 is stripped away—Step (k) exposing the central copper region 18, the features 20 and vias 25, 26. Now insulating material 28 is applied around the copper features 20 and vias 25, 26 (IV)—Step (l). In a preferred processing route, application of the insulating layer is by lamination of a prepreg that is preferably a fiber-matrix composite material as described hereinbelow.

The insulating material 28 may comprise a thermoplastic matrix material such as Teflon and derivatives thereof, or a thermosetting polymeric resin such as bismaleimide triazine, epoxy resins, polyimide resins, mixtures thereof, or a resin having mixed thermoplastic and thermosetting properties. Preferably the polymeric resin of the insulating material 28 includes inorganic particulate fillers, usually of a ceramic or glass, having particle sizes of the order of single microns, specifically, between 0.5 microns and 5 microns; the polymeric matrix containing 15% to 30% of particulate filler by weight.

In preferred embodiments, the insulating material 28 is a fiber matrix composite material including organic fibers such as polyamide fibers (Kevlar) or glass fibers. Such fibers may be chopped fibers or continuous fibers arranged in cross-plied arrangements or as woven mats. Cross plied and woven fiber mats pre-impregnated with partially cured polymeric resins are available as prepregs.

In most preferred embodiments, two woven fiber prepregs of fibers—matrix composite materials having ceramic fillers in the polymer matrix are used. Suitable candidate epoxy and polyamide matrix woven prepregs are available from Arlon Inc. Rancho Cucamonga, CA, USA or Hitachi Chemical Co., Ltd., Shimodate Works, Japan These prepregs are applied over the copper vias 26, and are cured by a hot press lamination process. The continuous fibers running though the insulating layers provide additional strength and stiffness, allowing the overall structure to be thinner, and further facilitate the attainment of planarity.

Firstly, the insulating material 28 is applied. Where a composite prepreg is used, it is applied over the copper features 20 and vias 26 and is then cured. The insulating material 28 is thinned down by a thinning process—Step (m) to expose the ends of the vias 25, 26 of the copper substructure therebeneath. The thinning step may include dry etching, mechanical grinding, chemical mechanical polishing (CMP) or combinations thereof. Typically dry etching will be followed by chemical mechanical polishing. To remove debris from the thinning process, and to remove polymeric smear from over the copper vias 26, a post-thinning cleaning process appropriate to the specific insulating material is applied—Step (n) (not shown). For example, where the insulating material 28 includes an epoxy polymer or a polyimide polymer, the post thinning cleaning process might include application of a potassium permanganate solution, typically at a concentration of 55 to 75 grams per liter of $KMnO_4$ at a temperature of between 70° C. and 95° C., or thereabouts. Additionally or alternatively, a plasma dry etch process may be applied.

Now a second barrier metal layer is applied (V). In one processing route, the barrier metal layer 30 is deposited—step (o) and a copper seed layer is deposited thereupon—step (p).

The barrier metal layer 30 may be tantalum, tungsten, titanium, titanium-tungsten and titanium-tantalum for example, and, in all cases may be deposited by a physical deposition process such as sputtering. Typically the barrier metal 30 has a thickness in the range of 0.1 micron to 1 micron. However, other thicknesses are possible.

To aid subsequent deposition of copper thereupon, the barrier metal layer 30 preferably also serves as an adhesive metal layer, and, consequently, is typically, tantalum, tungsten, titanium, titanium-tungsten- or titanium-tantalum.

To further facilitate good deposition and adhesion of copper thereupon, a copper seed layer is deposited, for example, by sputtering—step (p) or by sputtering followed by electro-plating, A fourth layer of photoresist 34 is now applied and developed to selectively expose the seeded barrier metal layer 30—step (q). Next, copper features 40 are deposited into the pattern of the photoresist 34 by a pattern plating deposition technique, typically electroplating or electroless plating. The photoresist 34 is then stripped away—step (s).

A further, thicker layer of photoresist 42 is now deposited over and around the copper features 40, and this is selectively developed to form channels through to the copper features 40 thereunder—step (t). Copper vias 44 are deposited into the channels by a suitable technique such as electroplating or electroless plating, for example—step (u). The photoresist 34 is then removed, leaving the copper vias 44 on the copper features 20 thereunder and exposing the copper seed layer 32 and the adhesive/barrier layer 30 thereunder—step (v) and the copper seed layer 32 and the adhesive/barrier layer 30 thereunder are now themselves removed—step (w). Where titanium-tantalum is used as the adhesive barrier layer 30, the tantalum can be removed by plasma etching using a mixture of $CF_4$ and Ar, typically having a $CF_4$ to argon ratio of between 1:1 and 3:1, and the titanium can be removed by using 5% solution of aqueous hydrofluoric acid (HF) at room temperature.

The particle filler within the polymeric matrix of the first insulating layer 24 provides a microroughness that aids adhesion of the barrier metal layer 30 thereto, and thus barrier metal layer 30 also serves as an adhesive metal.

The copper features 40 and vias 44 are surrounded with a second layer of insulating material 46 (VIII). Essentially, the second insulating layer 46 is applied—step (x). It is then thinned to expose the ends of the vias 44—step (y). Debris from the cleaning process and polymer smear is removed—step (z). As with first layer of insulating material 24, the second insulating material 46 may also be a fiber matrix composite material including organic fibers such as polyamide fibers (Kevlar) or glass fibers, mutatis mutandis.

The thinning process—step (y) may include dry etching, mechanical grinding, chemical mechanical polishing (CMP) or combinations thereof. Typically dry etching will be followed by chemical mechanical polishing. To remove debris from the thinning process, a post-thinning cleaning process appropriate to the polymeric material selected for the insulating layer 46 is applied—Step (z) (not shown). For example, where the polymeric material is an epoxy or polyimide, the post thinning cleaning process might include application of a potassium permanganate solution, typically at a concentration of 55 to 75 grams per liter of $KMnO_4$ at a temperature of 70° C. to 95° C. Additionally or alternatively, a plasma dry etch process may be applied.

The vias 44 may be etched to activate, perhaps by $(NH_4)_2S_2O_8$ at 50° C. to 55° C.

Where a more complicated structure with yet further layers is required, the above steps may be repeated, building up further layers of features and vias.

A third layer of copper features 54 is now deposited (IX). In one processing route, a third barrier metal layer 48—step (aa) is deposited, and a copper seed layer 50 is deposited thereupon—step (ab). A sixth layer of photoresist 52 is applied and developed to form a further pattern—step (ac) and the third layer of copper features 54 are deposited therewithin by a pattern plating technique—step (ad). The sixth layer of photoresist 52 is now stripped away—step (ae), leaving the copper features 54 and exposing the copper seed layer 50 and the adhesive/barrier layer 48 thereunder. The copper seed layer 50 and the adhesive/barrier layer 48 thereunder are now themselves removed—step (af). For example, where titanium-tantalum is used as the adhesive barrier layer 48, the tantalum can be removed by plasma etching with a mixture of $CF_4$ and Ar, typically having a $CF_4$ to argon ratio of between 1:1 and 3:1 and the titanium can be removed with a 5% aqueous solution of hydrofluoric acid (HF) at room temperature.

The third barrier metal layer 48 serves to bond the third copper seed layer 50 to the second insulating layer 46 to prevent delamination, and may be fabricated from tantalum, tungsten, titanium, a titanium-tungsten- and titanium-tantalum, for example.

The particle filler within the polymeric matrix of the insulating layer 46 provides a microroughness that aids adhesion of the barrier metal layer 48 thereto.

Now the upper surface of the IC support is terminated (X). In one termination route, for wirebonding an integrated circuit thereto, a layer of soldermask 56 is applied over and around the copper features 54 and a pattern of terminations is formed therein—step (ag). Nickel or gold is electroplated in the pattern of terminations to provide terminations 58 for wirebonding—step (ah).

A cavity 62 is then formed in the underside of the structure (XI). A layer of photoresist 60 is applied over the back side of the copper base 10 and is developed to expose the copper opposite the central copper region 18—step (ai) The exposed copper base 10 is etched away by a wet etch process—step (aj), with, the second barrier metal layer 30 fabricated in Step (p) acting as an etch stop to define the end of the cavity. The wet etch process for step (aj) of etching away the base layer 10 might include exposing to a solution of ammonium hydroxide at an elevated temperature, for example. The second barrier metal layer 30 may then be removed—step (ak), If fabricated from titanium-tanatalum, it may be removed by plasma etching using a mixture of $CF_4$ and Ar, typically having a $CF_4$ to argon ratio of between 1:1 and 3:1 followed by 5% aqueous hydrofluoric acid (HF) solution at room temperature other barrier metals being removable by other known techniques. The cavity 62 is terminated (XII). In one termination route, a layer of solder mask 64 is applied over the exposed composite 42 and copper features 36 and developed to expose part of the copper features—step (al). Solder balls 66 arranged in a ball grid array of are then applied—step (am). It will be appreciated that other terminations of the exposed copper features 36 are possible. These include Ni/Au deposited using electroless or electroplating processes followed by electroplating of solder balls 66, or, for example, may include elecotroplating of solder balls directly onto the copper features 36.

Finally, the remainder of the copper base 10 is etched away and the exposed conduits are terminated (XIII) as follows: The photoresist 60 is removed—step (an) and the remainder of the copper base layer 10 is etched away by a wet etch process—step (ao), with the first barrier metal layer 14 fabricated in step (c) acting as an etch stop. The wet etch process for step (ao) of etching away the base layer 10 might be exposing to a solution of ammonium hydroxide at an elevated temperature, for example. The exposed barrier metal layer 14 is now terminated—Step (ap), typically with solder balls 68.

Referring back to FIG. 1, in this manner, an IC support having dimensions of, say, 14 mm×14 mm may be formed, having a cavity 480 therein of, say, 9 mm×9 mm. A first IC die 410, which may be a memory die for example, may be wire bonded to the Ni/Au terminations 408 on the top side of the IC support structure 400 thus formed, and covered with a protective molding material 412. A second IC die 490, may be connected by a ball grid array of solder bumps 472 within the cavity 480 with voids thereover and therearound being filled by application of a resinous underfill material 413. The resin under-fill 413 acts as a stress buffer, and reduces the fatigue on second IC die 490 and the solder bumps 472 during thermal cycling over the life time of the package 450. Solder balls 402 or other contacts may be applied over the outer vias 436, and in this manner, a compact, reliable packaging support for a first IC die 410 and a second IC die 490 may be fabricated.

It will be appreciated that using the methodology described above, multilayer coreless, cavity IC support substrates having more feature layers may be built up to accommodate more sophisticated IC dies including various types of memory chips and processors, for example. The coreless cavity IC support substrate may be used for many purposes, and the processing route described above is capable of some variation to accommodate different integrated circuit chips and other components.

Furthermore, the overall dimensions of the multilayer coreless, cavity IC support substrate of the invention may vary widely, as may the dimensions of the various layers thereof.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A method of fabricating a cavity IC substrate comprising the steps of:
    selecting a copper base—step (a);
    (I) applying a barrier metal layer;
    (II) applying a first feature layer;
    (III) applying a first layer of vias;
    (IV) applying a first layer of insulating material around the copper features and vias;
    (V) applying a second barrier metal layer;
    (VI) applying a second layer of copper features;
    (VII) applying a second layer of vias;
    (VIII) applying a second layer of insulating material around the copper features and vias;
    (IX) applying a third layer of copper features to form a multilayered structure;
    (X) applying terminations on upper surface of the multilayered structure;
    (XI) forming a cavity in the underside of the multilayered structure;
    (XII) terminating contacts in the cavity;
    (XIII) etching away the remainder of the copper base; and
    (XIV) terminating the exposed conduits.

2. The method of claim 1, wherein step I of applying a barrier metal layer comprises the following substeps:
    applying a first layer of photoresist onto the copper base and developing to form a first pattern—step (b);
    depositing the first barrier metal layer into the pattern—step (c), and
    stripping away the first layer of photoresist—step (d).

3. The method of claim 2 wherein the first barrier metal layer is selected from the group consisting of nickel, gold, gold followed by nickel, tin, lead and tin-lead alloys.

4. The method of claim 1, wherein step II of applying a first feature layer comprises the following substeps:
    applying a second layer of photoresist and developing a second pattern that exposes a central region of the copper base layer and the first barrier metal layer—step (e);
    depositing a first copper seed layer onto the first barrier metal layer—step (f);
    building up a first copper feature layer—step (g), and
    stripping away the second layer of photoresist—step (h).

5. The method of claim 1, wherein step III of applying a via layer comprises the following substeps:
    applying a third, thicker layer of photoresist and developing a third pattern thereby exposing the central copper region and creating narrow passageways through the third layer of photoresist down to features of the first feature layer—step (i);
    pattern plating copper into the third pattern to build up the central copper region and to create vias that connect to the features of the first feature layer—step (j), and
    stripping away the third layer of photoresist and exposing copper therebeneath—step (k).

6. The method of claim 1, wherein step IV of applying an insulating material comprises the following substeps:
    laminating an insulating material over exposed copper substructure —step (1);
    thinning down the insulating layer by a thinning process to expose outer surface of copper substructure therebeneath—step (m), and
    cleaning to remove debris from the thinning process and to remove polymeric smear from over the exposed outer surface of copper —step (n).

7. The method of claim 6, wherein said thinning process of step (m) is selected from the group consisting of dry etching, mechanical grinding, chemical mechanical polishing (CMP) and combinations thereof.

8. The method of claim 6, wherein said thinning process of step (m) comprises dry etching followed by chemical mechanical polishing.

9. The method of claim 6, wherein said insulating material of step (IV) comprises an epoxy and said post thinning cleaning process of step (n) comprises at least one technique selected from the group consisting of:
    (i) applying a potassium permanganate solution at a concentration of between 55 and 75 grams per liter of $KMnO_4$ at a temperature of between 70° C. to 95° C., and
    (ii) a plasma dry etch process.

10. The method of claim 1, wherein step V of depositing a second barrier metal layer comprises the following substeps:
    depositing a second barrier metal layer—step (o), and
    depositing a copper seed layer onto the second barrier layer—step (p).

11. The method of claim 10 wherein said second barrier metal layer is selected from the group consisting of tantalum, tungsten, titanium, titanium-tungsten and titanium-tantalum.

12. The method of claim 10, wherein the second barrier metal layer has a thickness in the range of between 0.1 micron and 1 micron.

13. The method of claim 10 wherein said step of depositing (p) comprises a physical vapor deposition process.

14. The method of claim 13 wherein the physical vapor deposition process comprises sputtering.

15. The method of claim 1, wherein step VI of depositing a feature layer comprises the substeps of:
    applying a fourth layer of photoresist and developing the fourth layer of photoresist to selectively expose the copper seed layer—step (q);
    pattern electroplating a copper conductor layer into the fourth layer of photoresist—Step (r), and
    stripping away the fourth layer of photoresist—step (s).

16. The method of claim 1, wherein step VII of depositing a second via layer comprises the following substeps:
    applying and developing a fifth layer of photoresist to form a fifth pattern—step (t);

depositing copper therein to form a second layer of vias—step (u);

stripping away the fifth layer of photoresist—step (v), and removing exposed copper seed layer and adhesion/barrier metal layers—step (w).

17. The method of claim 1, wherein step VIII of surrounding the copper features and vias with an insulating material comprises the following substeps:

laminating a second insulating layer over the exposed copper features and vias—step (x);

thinning down the insulating layer by a thinning process to expose the copper substructure therebeneath—step (y), and cleaning to remove polymer smear and debris from thinning process—step (z).

18. The method of claim 1, wherein step IX of applying a third layer of copper features comprises the steps of:

depositing a third barrier metal layer—step (aa);

depositing a copper seed layer onto the third barrier metal layer—step (ab);

applying and developing a sixth layer of photoresist to form a sixth pattern—step (ac);

pattern plating a third layer of copper features therewithin—step (ad);

stripping away sixth layer of photoresist—step (ae), and removing exposed copper seed layer and adhesion/barrier metal layers—step (af).

19. The method of claim 18 wherein said third barrier metal layer is selected from the group consisting of tantalum, tungsten, titanium, titanium-tungsten and titanium-tantalum.

20. The method of claim 18, wherein the third barrier metal layer has a thickness in the range of from 0.1 micron to 1 micron.

21. The method of claim 18 wherein said step of depositing (ab) comprises a physical vapor deposition process.

22. The method of claim 21 wherein the physical vapor deposition process comprises sputtering.

23. The method of claim 1, wherein step X of terminating comprises the steps of:

applying a layer of soldermask over and around the third layer of copper features and developing a pattern of terminations—step (ag), and plating Ni/Au into the pattern of terminations to provide terminations for wirebonding—step (ah).

24. The method of claim 23, wherein said (ah) of plating Ni/Au is by a technique selected from the group consisting of electroplating and electroless plating.

25. The method of claim 1, wherein step XI of forming a cavity in the underside of the structure comprises the steps of:

applying a layer of photoresist over the underside of the copper base layer and developing to expose the copper opposite central copper region—step (ai);

etching away the exposed copper by a wet etch process—step (aj), and removing the barrier metal layers—step (ak).

26. The method of claim 1, where step XII of terminating the contacts within the cavity comprises the steps of:

applying a layer of solder mask in place of the removed second barrier layer and developing the solder maks layer to expose part of the copper features—step (al), and depositing metal terminations on solder maks exposed copper features (am).

27. The method of claim 1, where step XIII of terminating the multilayered structure comprises the steps of:

removing photoresist—step (an) and etching away remains of copper base (ao).

28. The method of claim 1, said copper base having a thickness in the range of 75 μm to 600 μm.

29. The method of claim 1 wherein at least one insulating layer comprises a composite material having a polymeric matrix with fiber reinforcement.

30. The method of claim 29 wherein said polymeric matrix further comprises a particle filler.

31. A cavity IC support fabricated by the method of claim 1.

32. The cavity IC support of claim 31 for supporting a first IC die connected in series with a second IC die; the IC support comprising a stack of alternating layers of copper features and vias in an insulating surround, the first IC die being bondable onto the IC support, and the second IC die being bondable within a cavity inside the IC support.

33. The IC support of claim 32, wherein the insulating suround comprises a composite material having a polymeric matrix having particulate filler and fiber reinforcement.

34. The IC support of claim 32 having a thickness of not more than 400 microns.

35. The IC support of claim 32, being less than 15 mm×15 mm in area.

36. The IC support of claim 32 comprising a cavity that is at least 8 mm×8mm and has a depth of 100 microns.

* * * * *